United States Patent [19]

Konishi et al.

[11] Patent Number: 5,579,502

[45] Date of Patent: Nov. 26, 1996

[54] MEMORY CARD APPARATUS USING EEPROMS FOR STORING DATA AND AN INTERFACE BUFFER FOR BUFFERING DATA TRANSFER BETWEEN THE EEPROMS AND AN EXTERNAL DEVICE

[75] Inventors: Kazuo Konishi; Shimpei Yoshioka, both of Yokohama; Setsuo Terasaki, Kamakura; Hiroaki Matsubara, Fukaya; Koji Maruyama, Yokohama; Toshiaki Sato, Fukaya; Takaaki Suyama, Honjo, all of Japan

[73] Assignee: Kabushiki Kaisha Toshiba, Kawasaki, Japan

[21] Appl. No.: 505,369

[22] Filed: Jul. 21, 1995

Related U.S. Application Data

[63] Continuation of Ser. No. 330,606, Oct. 28, 1994, abandoned, which is a continuation of Ser. No. 924,881, Aug. 6, 1992, abandoned.

[30] Foreign Application Priority Data

| Aug. 9, 1991 | [JP] | Japan | 3-200308 |
| Aug. 9, 1991 | [JP] | Japan | 3-200309 |
| Aug. 9, 1991 | [JP] | Japan | 3-200310 |
| Aug. 9, 1991 | [JP] | Japan | 3-200311 |
| Aug. 9, 1991 | [JP] | Japan | 3-200519 |
| Aug. 9, 1991 | [JP] | Japan | 3-200520 |
| Aug. 9, 1991 | [JP] | Japan | 3-200522 |
| Aug. 9, 1991 | [JP] | Japan | 3-200523 |
| Aug. 9, 1991 | [JP] | Japan | 3-200524 |
| Aug. 9, 1991 | [JP] | Japan | 3-200705 |

[51] Int. Cl.[6] .................................................. G06F 12/04

[52] U.S. Cl. .................... 395/430; 395/442; 235/492; 364/DIG. 1; 364/238.6; 364/252.6; 364/254.3

[58] Field of Search .................................. 395/430, 442; 235/380, 492; 348/207, 231; 365/185, 230.03, 900

[56] References Cited

U.S. PATENT DOCUMENTS

| 4,758,883 | 7/1988 | Kawahara et al. | 358/44 |
| 4,803,554 | 2/1989 | Pape | 358/209 |
| 5,093,731 | 3/1992 | Watanabe et al. | 358/335 |
| 5,153,730 | 10/1992 | Nagasaki et al. | 358/209 |
| 5,303,198 | 4/1994 | Adachi et al. | 365/218 |

FOREIGN PATENT DOCUMENTS

| 0366474 | 5/1990 | European Pat. Off. . |
| 0372514 | 6/1990 | European Pat. Off. . |
| 2-222280 | 2/1990 | Japan . |

Primary Examiner—Eddie P. Chan
Assistant Examiner—Hiep T. Nguyen
Attorney, Agent, or Firm—Cushman, Darby & Cushman

[57] ABSTRACT

A memory card apparatus using EEPROMs as semiconductor memories. Externally input data are temporarily recorded in a buffer memory and are subsequently written in the EEPROMs. Verify processing is automatically performed between the buffer memory and the EEPROMs. Similarly, data read out from the EEPROMs are temporarily recorded in the buffer memory and are subsequently output to an external unit. Even with the EEPROMs, it seems that this memory card can be used in the same manner as a memory card using an SRAM, when viewed from the outside of the card.

11 Claims, 21 Drawing Sheets

| COMPARISON ITEM | SRAM CARD | EEPROM CARD |
|---|---|---|
| 1. BACKUP BATTERY | REQUIRED | NOT REQUIRED |
| 2. COST | HIGH | SLIGHTLY LOW |
| 3. WRITE SPEED (RANDOM) | HIGH | LOW |
| (PAGE) | — | SLIGHTLY HIGH |
| 4. READ SPEED (RANDOM) | HIGH | LOW |
| (PAGE) | — | SLIGHTLY HIGH |
| 5. ERASE MODE | PRESENT | ABSENT |
| 6. WRITE VERIFY | NOT REQUIRED | REQUIRED |

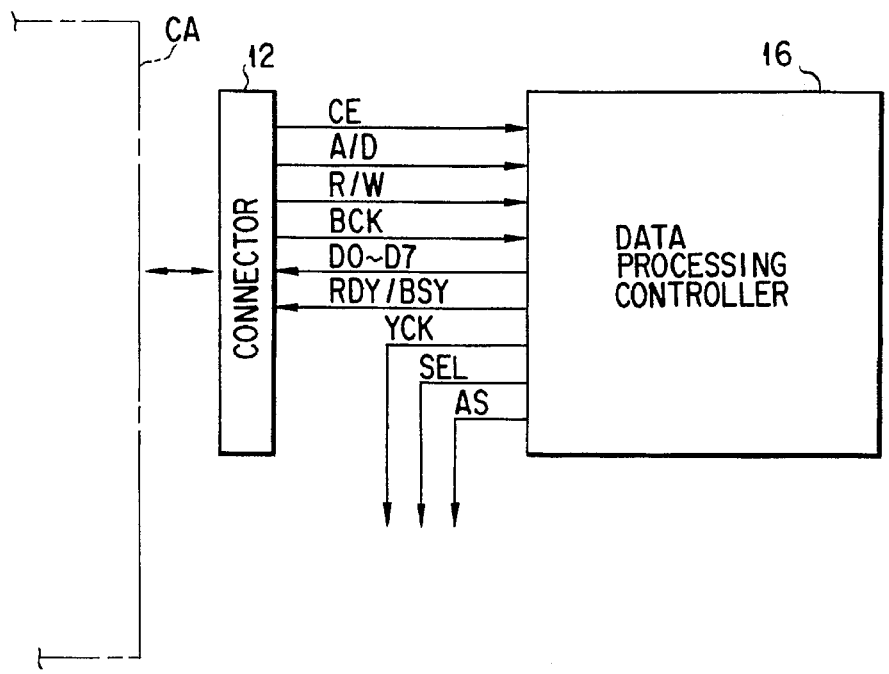
F I G. 4
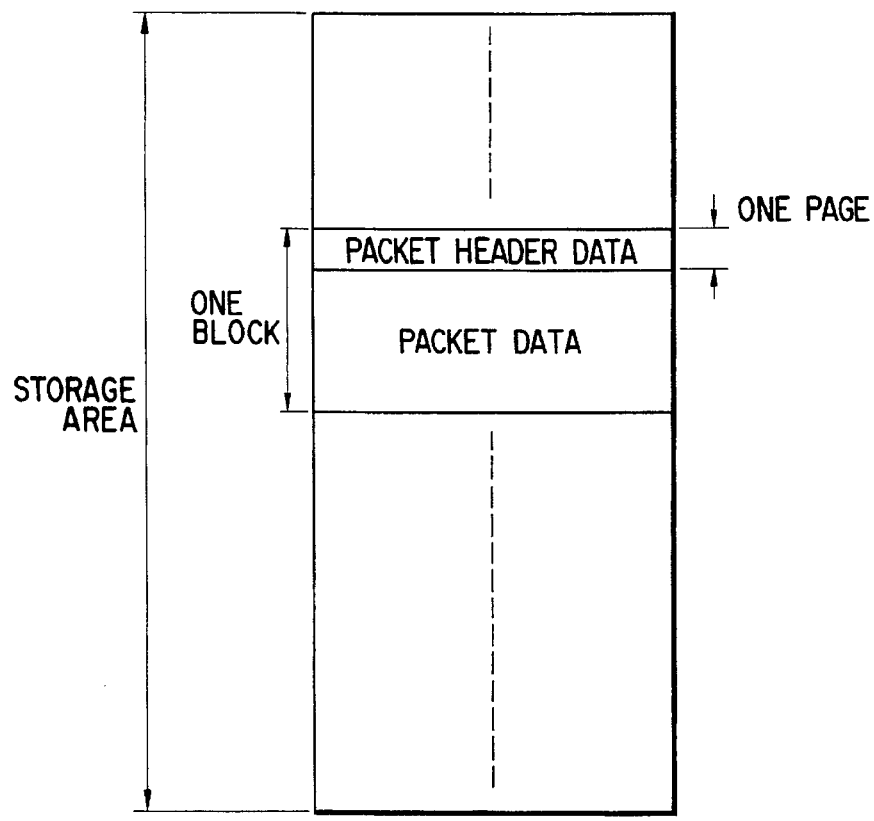
F I G. 6

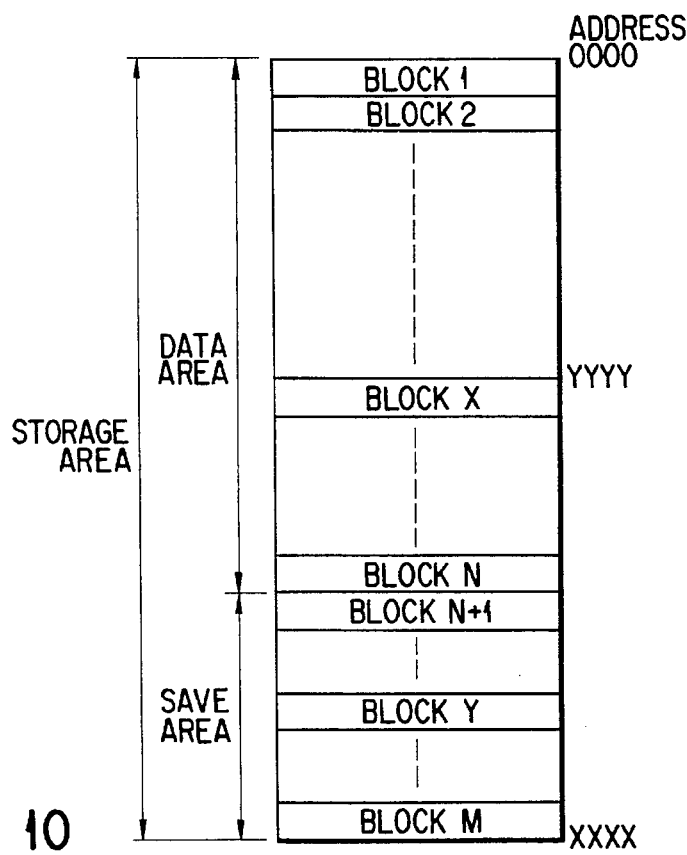
F I G. 10
F I G. 11
F I G. 12

B: DATA STORAGE AREA

A: HEADER DATA STORAGE AREA

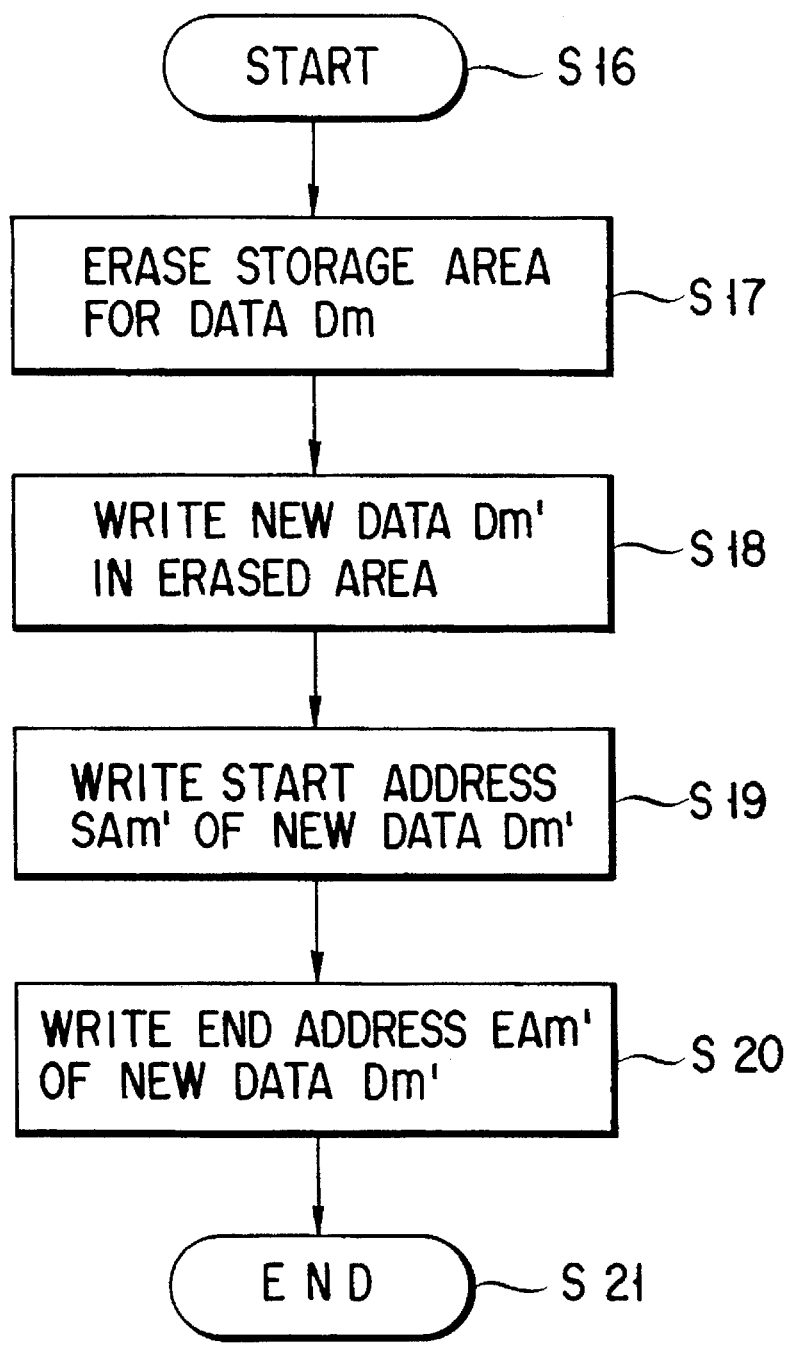
F I G. 21

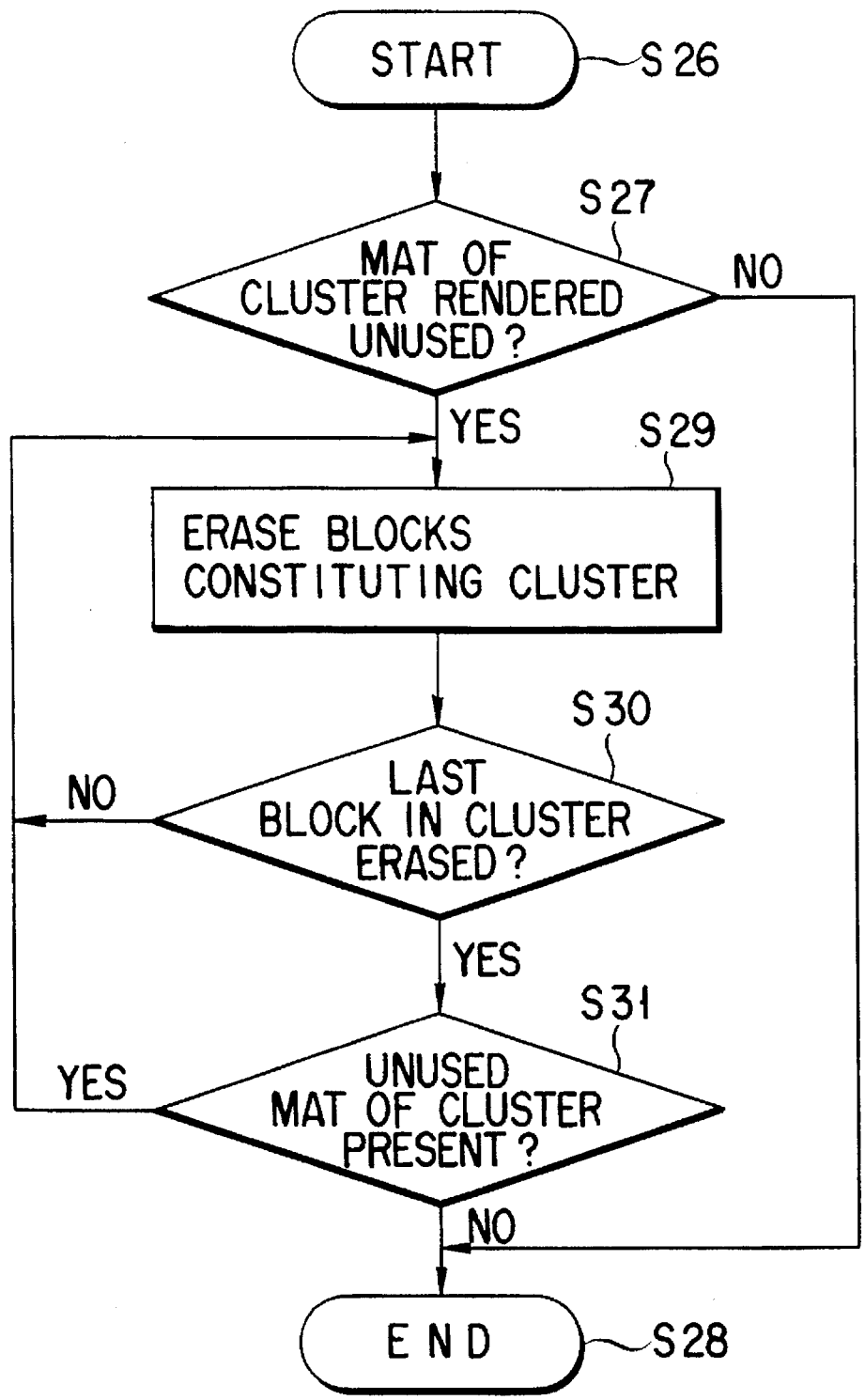
F I G. 27

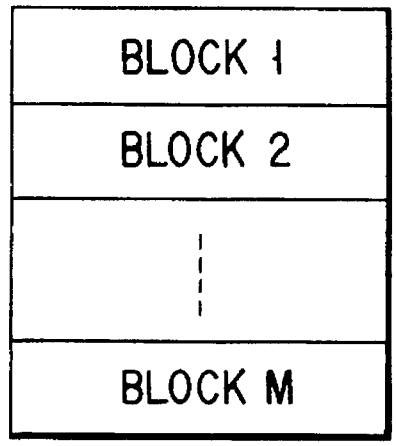
F I G. 29
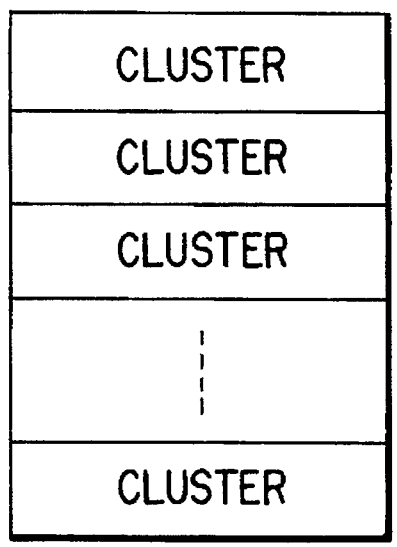
F I G. 30

| | | | |
|---|---|---|---|
| CARD ATTRIBUTE INFORMATION | | TAPLE ID (09h) | 000000h |
| | | POINTER (FFh) | 000001h |
| | DEVICE 0 | BANK 0 · DEVICE ID | 000002h |
| | | BANK 0 · DEVICE SIZE | 000003h |
| | | ↓ | |
| | DEVICE N | BANK N · DEVICE ID | |
| | | BANK N · DEVICE SIZE | |
| | | TAPLE INFORMATION END (FFh) | |
| | | RESERVED ALL 00h | 0003FFh |
| BANK · HEADER INFORMATION | FORMAT NUMBER TAPLE | TAPLE ID | 000400h |
| | | POINTER (FFh) | 000401h |
| | | FORMAT NUMBER | 000402h |
| | | TAPLE INFORMATION END (FFh) | 000403h |
| | TEMPORARY INFORMATION TAPLE | TAPLE ID | 000404h |
| | | POINTER (FFh) | 000405h |
| | | REMAINING CLUSTER COUNT IN BANK | 000406h |
| | | REMAINING CLUSTER COUNT IN BANK | 000408h |
| | | LAST USED PACKET NUMBER IN BANK | 00040Ah |
| | | FIRST UNUSED CLUSTER NUMBER IN BANK | 00040Ch |
| | | PARITY | 00040Eh |
| | | TAPLE INFORMATION END (FFh) | 00040Fh |
| | CARD NUMBER TAPLE | TAPLE ID | 000410h |
| | | POINTER (FFh) | 000411h |
| | | CARD NUMBER | 000412h |
| | | TAPLE INFORMATION END (FFh) | 000413h |
| | NATIVE LANGUAGE CHARACTER STRING TAPLE | TAPLE ID (16h) | 000414h |
| | | POINTER (FFh) | 000415h |
| | | ESCAPE SEQUENCE | |
| | | NATIVE LANGUAGE CHARACTER STRING 1 | |
| | | ↓ | |
| | | NATIVE LANGUAGE CHARACTER STRING N | |
| | | TAPLE CHAIN END (FFn) | |
| | | OPTION ALL 00h | |

F I G. 31A

| | | |
|---|---|---|
| PACKET SELECTION INFORMATION | TYPE/ATTRIBUTE OF PACKET 0 (82h) | 000800h |
| | TYPE/ATTRIBUTE OF PACKET 1 (82h) | 000801h |
| | TYPE/ATTRIBUTE OF PACKET 2 | 000802h |
| | TYPE/ATTRIBUTE OF PACKET 3 | 000803h |
| | ↓ | |
| | TYPE/ATTRIBUTE OF PACKET 2047 | 000FFFh |
| INFORMATION ASSOCIATED WITH PACKET | INFORMATION ASSOCIATED WITH PACKET 0 (00h, 00h) | 001000h |
| | INFORMATION ASSOCIATED WITH PACKET 1 (00h, 00h) | 001002h |
| | INFORMATION ASSOCIATED WITH PACKET 2 | 001004h |
| | ↓ | |
| | INFORMATION ASSOCIATED WITH PACKET 2047 | |
| DIRECTORY INFORMATION | START CLUSTER (00h) OF PACKET 0 (00h) | 002000h |
| | START CLUSTER (01h) OF PACKET 1 (00h) | 002002h |
| | START CLUSTER OF PACKET 2 | 002004h |
| | ↓ | |
| | START CLUSTER OF PACKET 2047 | |
| MAT | MAT (FFh) OF CLUSTER 0 (FFh) | 003000h |
| | MAT (FFh) OF CLUSTER 1 (FFh) | 003002h |
| | MAT OF CLUSTER 2 | 003004h |
| | ↓ | |
| | MAT OF CLUSTER 2047 | 003FFEh / 003FFFh |
| | DATA STORAGE AREA OF BANK 0 | 004000h |
| | | FFFFFFh |

F I G. 31B

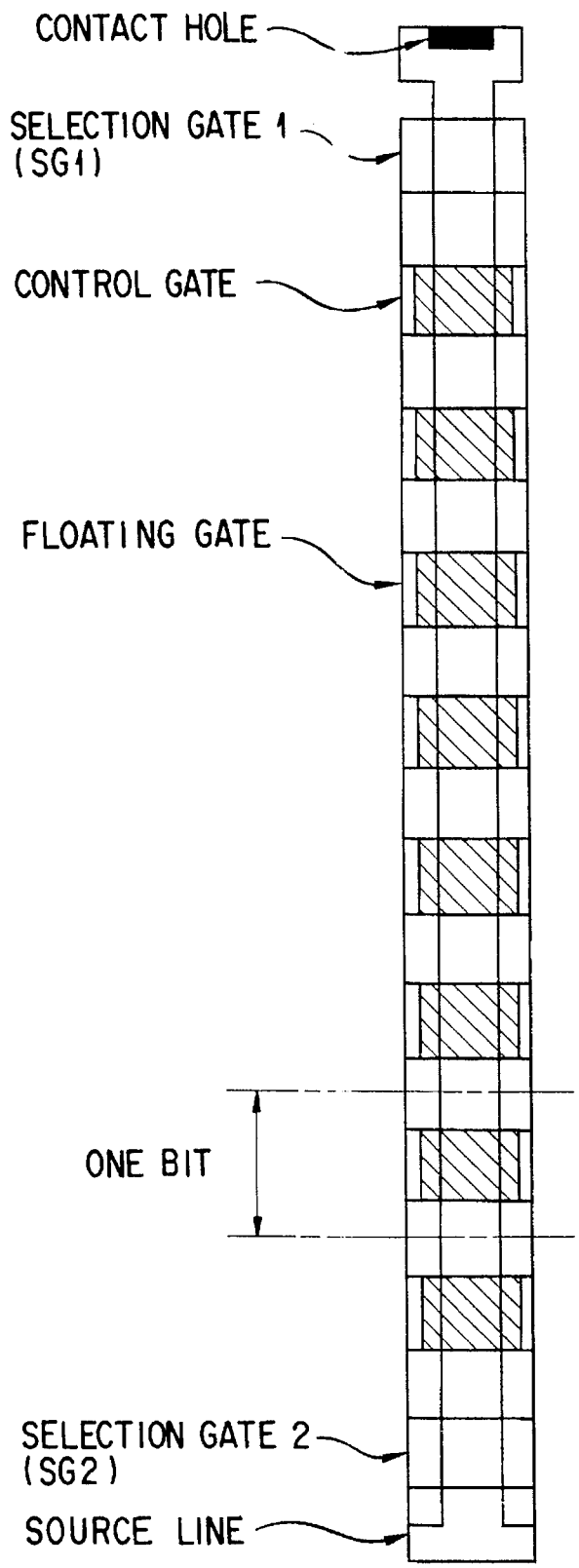
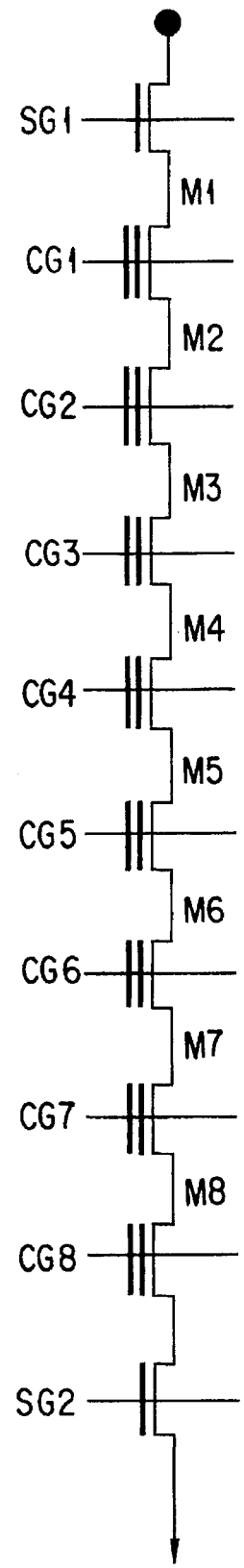
F I G. 32A  F I G. 32B

MEMORY CARD APPARATUS USING EEPROMS FOR STORING DATA AND AN INTERFACE BUFFER FOR BUFFERING DATA TRANSFER BETWEEN THE EEPROMS AND AN EXTERNAL DEVICE

This is a continuation of application Ser. No. 08/330,606, filed on Oct. 28, 1994, which was abandoned upon the filing hereof which was a continuation of application Ser. No. 07/924,881, filed Aug. 6, 1992 also abandoned.

BACKGROUND OF THE INVENTION

1. Field of the Invention

The present invention relates to a memory card apparatus using an EEPROM (electrically erasable and programmable read-only memory) as a semiconductor memory and, more particularly, to a memory card apparatus suitably used for an electronic still camera or the like which is designed to convert a photographed optical image of an object to be photographed into digital image data and to record the converted data in a semiconductor memory.

2. Description of the Related Art

As is generally known, an electronic still camera apparatus has been developed. This apparatus is designed to convert a photographed optical image of an object to be photographed into an electrical image signal, convert the image signal into digital image data, and record the data in a semiconductor memory. In an electronic still camera of this type, a memory card having a semiconductor memory incorporated therein is designed to be detachably mounted in a camera main body so that the memory card can be handled in the same manner as a film for a general camera.

The standardization of memory cards for electronic still camera apparatuses is now in progress. As a built-in semiconductor memory, a large-capacity memory is required in order to record digital image data corresponding to a plurality of frames. As such a memory, an SRAM (static random access memory), a mask ROM, or an EEPROM capable of electrically recording and erasing data, or the like has been considered. A memory card using an SRAM has already been on the market.

A memory card using an SRAM is advantageous in that it can conform to the data arrangement of any kind of format, and has a high data write/read speed. However, a backup battery must be housed in the memory card to retain written data. Consequently, the storage capacity is reduced according to the space for housing the battery. In addition, since the SRAM is high in cost, the use of it is economically disadvantageous.

In order to eliminate the drawbacks of the SRAM, a great deal of attention has currently been paid to an EEPROM as a semiconductor memory used for a memory card. The EEPROM attracts attention as a recording medium replacing a magnetic disk. The EEPROM has its own advantages in that for example, the EEPROM needs no backup battery for retaining data. It also allows a reduction in cost of a chip itself. Owing to such advantages, the development of an EEPROM used for a memory card is progressing rapidly.

FIG. 1 shows the merits and demerits of a memory card (SRAM card) using an SRAM versus a memory card (EEPROM card) using an EEPROM for comparison. First, with regard to "backup battery" and "cost" as comparison items 1 and 2, as described above, the SRAM card requires a backup battery and is high in cost, whereas the EEPROM card requires no backup battery and allows a reduction in cost.

Next, with regard to "write speed" and "read speed" as comparison items 3 and 4, consider a random access mode common to the SRAM and the EEPROM, in which a data write/read operation is performed with respect to a byte or bit arbitrarily designated by an address, and a page mode unique to the EEPROM, in which a data write/read operation is performed in units of pages by designating a page consisting of a plurality of consecutive bytes (several hundred bytes).

In the random access mode, both the write and read speeds of the SRAM are high, whereas those of the EEPROM are low. In the page mode, since a large number of data corresponding to one page are written/read in/from the EEPROM, its write and read speeds are higher than those in the random access mode.

"Erase mode" as comparison item 5 is unique to the EEPROM but is not preset in the SRAM. More specifically, in the EEPROM, data cannot be newly written in an area in which data has already been written without erasing the previously written data first. Therefore, when data is to be written, this erase mode is executed. The erase mode includes a chip erase operation in which all the stored contents of the EEPROM are erased at once, and a block erase operation in which stored contents are erased in units of blocks, each (several kbytes) consisting of a plurality of pages.

With regard to "write verify" as comparison item 6, this mode is also unique to the EEPROM but is not present in the SRAM. Generally, in the EEPROM, data cannot be completely written by one write operation. For this reason, every time a write operation is performed with respect to the EEPROM, the written contents must be read out from the EEPROM to check whether the data is correctly written. This operation is performed in the write verify mode.

More specifically, data to be written in the EEPROM is recorded in a buffer memory in advance. After the data transferred from the buffer memory is written in the EEPROM, the written contents of the EEPROM are read out to check whether the readout contents coincide with the contents of the buffer memory. If an incoincidence (error) is determined as a result of the write verify operation, the contents of the buffer memory are written in the EEPROM again.

As is apparent from the above comparison, the EEPROM has unique merits which the SRAM does not have, e.g., the ability to operate without a backup battery, a low cost, and the ability to perform a data write/read operation in units of pages. However, the EEPROM has some demerits as well. For example, the EEPROM has low data write and read speeds in the random access mode, and requires modes which the SRAM does not require, e.g., the erase mode and the write verify mode.

If, therefore, the EEPROM is to be used as a semiconductor memory for a memory card in place of the currently used SRAM, improvements in various aspects need to be made to details so as to allow the EEPROM card to be used in the same manner as the memory card incorporating the SRAM. For example, by eliminating some drawbacks, of the EEPROM card such as low data write and read speeds, and the necessity for the erase and write verify modes, an SRAM-card-like device having an EEPROM card may be used.

SUMMARY OF THE INVENTION

The present invention has been developed in consideration of the above, and has as its object to provide a memory card apparatus which allows the SRAM-card-like use of an EEPROM in data write and read processing.

According to one aspect of the present invention, there is provided a memory card apparatus for inputting and recording data including a first data group featured in that each data has a small total data amount and is often required to be written/read in units of bytes, and a second data group featured in that each data has a large total amount and is sequentially arranged as a whole. Such a memory card comprises a memory, capable of high-speed write and read operations of the data, for performing an input/output operation of the data with respect to an external unit, a first EEPROM, having a storage capacity large enough to record all the first data group and capable of performing a data write/read operation in units of bytes, for performing an input/output operation with respect to the memory, a second EEPROM, having a storage capacity large enough to record the second data group and capable of performing a data write/read operation in units of reference areas, each constituted by a plurality of consecutive bytes, for performing an input/output operation with respect to the memory, and a control circuit for determining whether data stored in the memory belongs to the first data group or the second data group, and selectively distributing the data to the first and second EEPROMs to store the data in that memory.

BRIEF DESCRIPTION OF THE DRAWINGS

FIG. 4 is a block diagram showing the arrangement of a memory card apparatus according to the third embodiment of the present invention;

FIG. 6 is a view for explaining the recording format of digital data in the EEPROM;

FIG. 10 is a view for explaining a memory card apparatus according to the sixth embodiment of the present invention;

FIG. 11 is a view for explaining a management table for a remedy area in the sixth embodiment;

FIG. 12 is a view for explaining a case wherein the remedy area is completely full in the sixth embodiment;

FIG. 21 is a flow chart for explaining the process of writing data in a memory card using an EEPROM;

FIG. 27 is a flow chart for explaining an erase operation inside the card in the ninth embodiment;

FIG. 29 is a view for explaining the arrangement of clusters in the tenth embodiment;

FIG. 30 is a view for explaining the arrangement of packets in the tenth embodiment;

FIGS. 31A and 31B are views for explaining the data format of a header data storage area in the memory space in the tenth embodiment; and FIGS. 32A and 32B are a plan view and an equivalent circuit diagram thereof, respectively showing memory cells using a NAND type structure which constitute an EEPROM applied to the present invention.

DETAILED DESCRIPTION OF THE PREFERRED EMBODIMENTS

Figure 2:
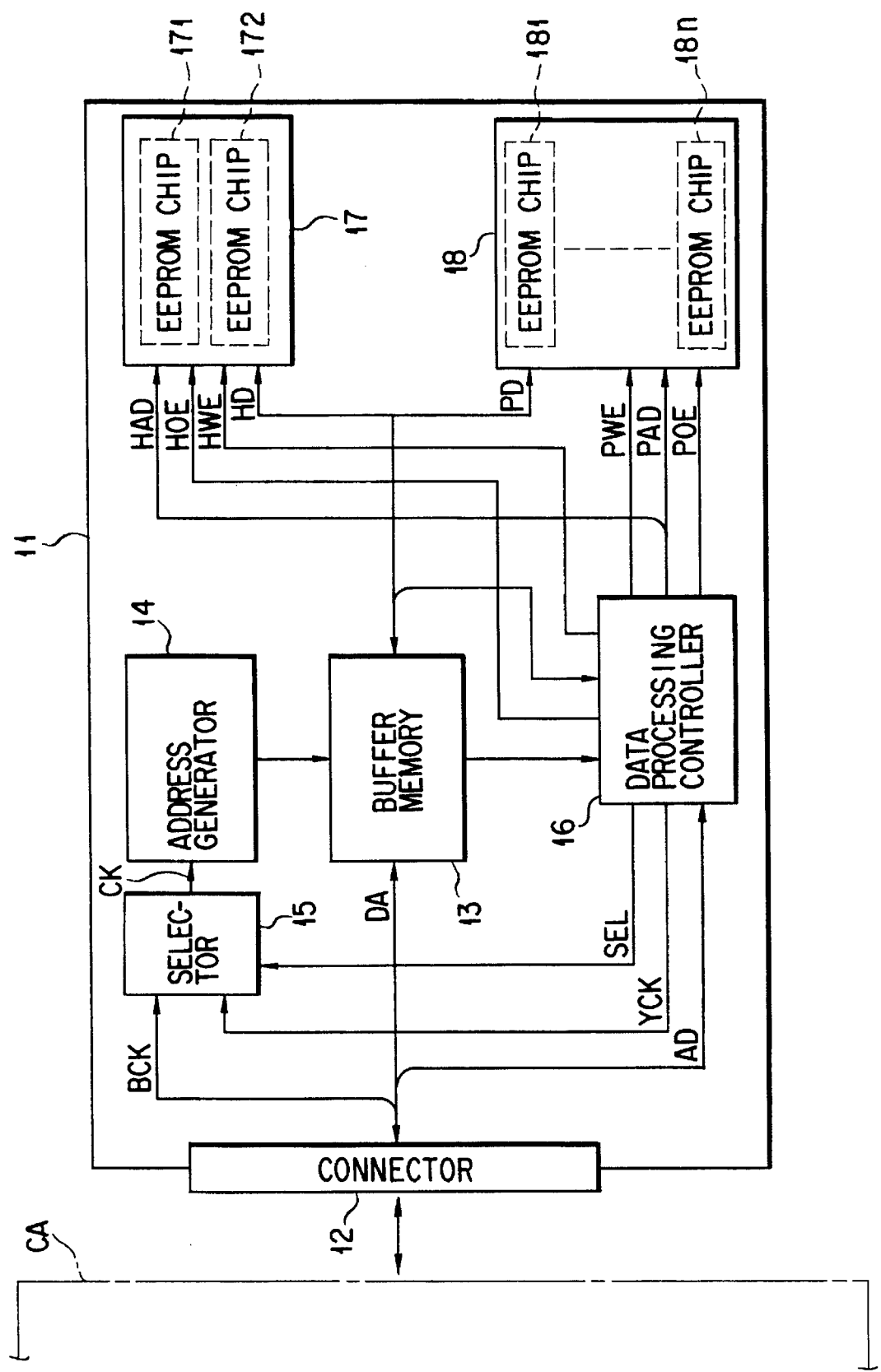
FIG. 2 is a block diagram showing the arrangement of a memory card apparatus according to the first embodiment of the present invention.

An embodiment in which the present invention is applied to an electronic still camera apparatus will be described in detail below with reference to the accompanying drawings. Referring to FIG. 2, reference numeral 11 denotes a memory card body, which is connected to an electronic still camera main body CA through a connector 12 arranged at one end portion of the memory card body 11. Digital data DA to be written in the memory card body 11 and address data AD indicating its write location are supplied from the electronic still cameral main body CA side to the connector 12.

Digital data DA supplied to the connector 12 is temporarily loaded and recorded in a buffer memory 13. The timing at which the digital data DA is loaded in the buffer memory 13 is controlled by address data output from an address generator 14. The address generator 14 counts clocks CK selected by a selector 15 to generate address data to be supplied to the buffer memory 13.

The selector 15 is designed to receive bus clocks BCK synchronized with the address data AD, and clocks YCK output from a data processing controller 16. When the digital data DA is to be loaded in the buffer memory 13, the selector 15 selects the bus clocks BCK in accordance with a select signal SEL output from the data processing controller 16, and supplies them, as the clocks CK, to the address generator 14.

The address data AD supplied to the connector 12 is supplied to the data processing controller 16, and it is discriminated whether the data is header address data HAD or image address data PAD. That is, the digital data DA output from the electronic still camera main body CA side includes header data HD as pieces of memory management information such as memory card attribute information, various types of information unique to each image data, date information, and remaining frame count information, and image (including speech) data PD corresponding to an object to be photographed.

If the data processing controller 16 determines that the input address data AD is the header address data HAD, the controller 16 outputs header write enable data HWE to a header EEPROM 17. The EEPROM 17 is constituted by a plurality (two in FIG. 2) of EEPROM chips 171 and 172. The EEPROM 17 is controlled such that data can be written only in a time interval during which the header write enable data HWE is active (e.g., at H level), but a write operation is inhibited in other time intervals.

If the data processing controller 16 determines that the input address data AD are the image address data PAD, the controller 16 outputs image write enable data PWE to an image EEPROM 18. This image EEPROM 18 is also constituted by a plurality of EEPROM chips 181 to 18n. The image EEPROM 18 is controlled such that data can be written only in a time interval during which the image write enable data PWE is active (e.g., at H level), and a write operation is inhibited in other time intervals.

In general, EEPROMs are classified into the first type which has a small storage capacity of several 10 kbytes but allows data write and read operations at relatively high speeds in units of bytes designated by addresses, and the second type which has a large storage capacity of several 10 Mbits but cannot perform a write/read operation in units of bytes. The second type, however, has a batch erase function of collectively erasing all storage contents, and a function of collectively performing a data write/read operation in units of pages.

Each header data HD of the digital data DA is characterized in that its total data amount is as small as 16 kbytes, and it mainly includes data required to be updated in units of bytes, such as date information and remaining frame count information. Therefore, as the header EEPROM 17 for recording the header data HD, an EEPROM of the first type described above, which has a small storage capacity and can perform a data write/read operation in units of bytes, is used.

Each image data PD of the digital data DA is characterized in that it has a very large data amount for one image frame and is sequential as a whole. Therefore, as the image EEPROM 18 for recording the image data PD, an EEPROM of the second type, which has a large storage capacity and has the batch erase function and the function of collectively performing a data write/read operation in units of pages, is used.

Assume that the digital data DA written in the buffer memory 13 through the connector 12 are the header data HD. In this case, the data processing controller 16 determines that the header data HD are input, because the input address data AD are the header address data HAD. As a result, the data processing controller 16 outputs the header address data HAD to the header EEPROM 17 and sets the header write enable data HWE in an active state.

Subsequently, the data processing controller 16 controls the select signal SEL to switch the selector 15 such that the clocks YCK generated by the controller 16 are supplied to the address generator 14. With this operation, the header data HD are sequentially read out from the buffer memory 13 in accordance with address data generated by the address generator 14 on the basis of the clocks YCK, and the readout data is written in the header EEPROM 17.

After all of the header data HD is written in the header EEPROM 17, the data processing controller 16 executes a write verify operation as follows. The controller 16 activates header output enable data HOE with respect to the header EEPROM 17, and outputs the header address data HAD to read out the written header data HD. The controller 16 then checks whether the readout header data HD coincide with the header data HD recorded in the buffer memory 13.

If the header data HD read out from the header EEPROM 17 do not coincide with the header data HD recorded in the buffer memory 13, the data processing controller 16 transfers the header data HD again from the buffer memory 13 to the header EEPROM 17 to write the data therein. This operation is repeated until the header data HD read out from the header EEPROM 17 completely coincide with the header data HD recorded in the buffer memory 13, thereby completing the process of writing the header data HD.

Assume that the digital data DA written in the buffer memory 13 through the connector 12 are the image data PD. In this case, since the input address data AD are the image address data PAD, the data processing controller 16 determines that the image data PD are input. As a result, the controller 16 outputs the image address data PAD to the image EEPROM 18, and activates the image write enable data PWE.

The data processing controller 16 then controls the select signal SEL to switch the selector 15 such that the clocks YCK generated by the controller 16 are supplied to the address generator 14. As a result, the image data PD are sequentially read out from the buffer memory 13 in accordance with address data generated by the address generator 14 on the basis of the clocks YCK, and the readout data is written in the image EEPROM 18.

After all of the image data PD is written in the image EEPROM 18, the data processing controller 16 executes a write verify operation as follows. The controller activates image out enable data POE with respect to the image EEPROM 18, and outputs the image address data PAD to read out the written image data PD. The controller 16 then checks whether the readout image data PD coincide with the image data PD recorded in the buffer memory 13.

If the image data PD read out from the image EEPROM 18 do not coincide with the image data PD recorded in the buffer memory 13, the data processing controller 16 transfers the image data PD again from the buffer memory 13 to the image EEPROM 18 to write the data therein. This operation is repeated until the image data PD read out from the image EEPROM 18 completely coincide with the image data PD recorded in the buffer memory 13, thereby completing the process of writing the image data PD.

The process of reading out the header data HD and the image data PD from the header EEPROM 17 and the image EEPROM 18, and outputting the readout data outside the memory card body 11 will be described below. Addresses at which data is read out from the electronic still camera main body CA side through the connector 12 are designated first. The designated addresses are supplied to the data processing controller 16, and it is determined whether the data is the header address data HAD or the image address data PAD.

Subsequently, the data processing controller 16 activates the header out enable data HOE and the image out enable data POE on the basis of the discrimination result, and switches the selector 15 such that the clocks YCK generated by the controller 16 are supplied to the address generator 14, thereby reading out the header data HD and the image data PD from the header EEPROM 17 and the image EEPROM 18, respectively, and writing the readout data in the buffer memory 13.

The data processing controller 16 then switches the selector 15 such that the bus clocks BCK supplied from the electronic still camera main body CA side through the connector 12 are supplied to the address generator 14. As a result, data is read out from the buffer memory 13 in accordance with address data generated by the address generator 14 on the basis of the bus clocks BCK. The readout data is supplied to the electronic still camera main body CA through the connector 12, and the header data HD and the image data PD are read out from the memory card body 11.

According to the arrangement of the embodiment described above, an EEPROM of the first type, which has a small storage capacity and can perform a data write/read operation in units of bytes at a relatively high speed, is used as the header EEPROM 17 for recording the header data HD characterized in that it has a small data amount and mainly includes data updated in units of bytes, and an EEPROM of the second type, which has a large storage capacity and can perform a batch erase operation and a batch data write/read operation in units of pages, is used as the image EEPROM 18 for recording the image data PD characterized in that it has a very large data amount and is sequential as a whole. Therefore, even with the EEPROMs used above, data can be arbitrarily updated in units of bytes or pages according to the type of data.

In addition, since data transfer between the electronic still camera main body CA and the memory card body 11 is always performed through the buffer memory 13, both the data write speed and the data read speed are increased, and the memory card can be used in the SRAM-card-like manner. Furthermore, since a write verify operation unique to the EEPROM is automatically performed between the buffer memory 13 and the header and image EEPROMs 17 and 18 inside the memory card body 11, data write/read processing can be performed in the SRAM-card-like manner when viewed from the electronic still camera main body CA side.

Figure 3:
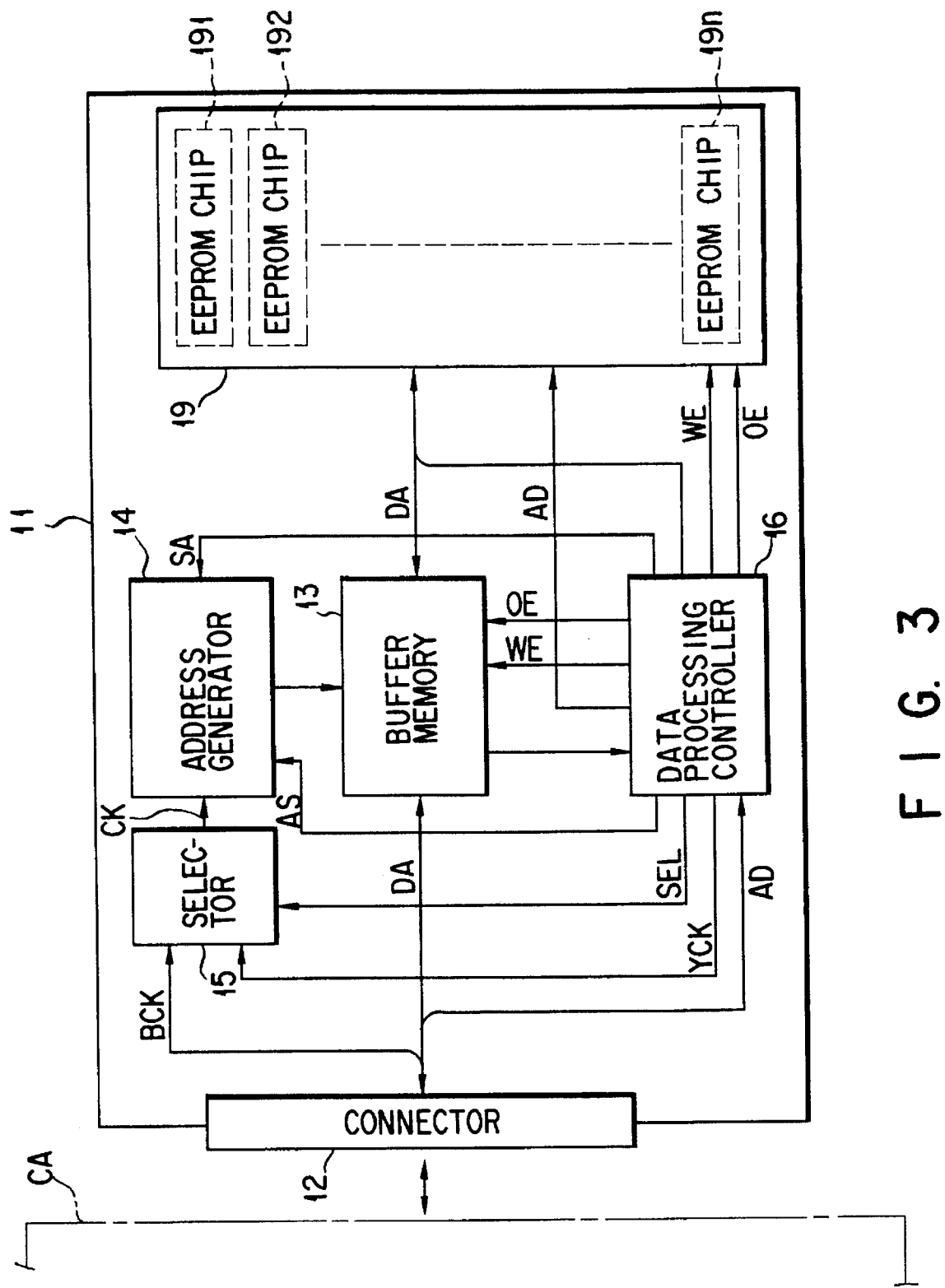
FIG. 3 is a block diagram showing the arrangement of a memory card apparatus according to the second embodiment of the present invention.

FIG. 3 shows the second embodiment of the present invention. The same reference numerals in FIG. 2 denote the same parts as in FIG. 1. The above-mentioned header data HD is characterized in that its total data amount is as small as 16 kbytes, and it mainly includes data required to be updated in units of bytes, such as date information and remaining frame count information. The above-mentioned buffer memory 13 has a storage capacity (16 kbytes or more) large enough to record all the header data HD. The image data PD is characterized in that is has a very large data amount for one image frame and is sequential as a whole.

Digital data DA loaded in the buffer memory 13 are read out and written in an EEPROM 19 under the control of a data processing controller 16. The EEPROM 19 is constituted by a plurality of EEPROM chips 191 to 19n and has a large storage capacity of 4 Mbits or more. Although the EEPROM 19 cannot perform a data write operation and a data erase operation in units of bytes, it can perform a batch erase operation or an erase operation in units of blocks, each consisting of several kbytes, and can perform a data write/read operation in units of pages, each consisting of several hundred bytes.

If the data processing controller 16 determines that input address data AD are header address data HAD, the controller 16 sets out enable data OE in an active state (e.g., at H level) with respect to the EEPROM 19, and generates the address data AD for designating the entire storage area of the header data HD in the EEPROM 19, thus reading out all the header data HD from the EEPROM 19 in units of pages.

Subsequently, the data processing controller 16 sets write enable data WE in an active state (e.g., at H level) with respect to the buffer memory 13, and controls a select signal SEL to switch a selector 15 such that clocks YCK generated by the controller 16 are supplied to an address generator 14. As a result, all the header data HD read out from the EEPROM 19 is written in the buffer memory 13 in accordance with address data generated by the address generator 14 on the basis of the clocks YCK.

After all the header data HD are written in the buffer memory 13, the data processing controller 16 generates set address data SA for designating bytes of the header data HD which are to be updated on the basis of the header address data HAD, and outputs the generated data to the address generator 14. In addition, the controller 16 outputs address set data AS to the address generator 14 to set the set address data SA therein.

The address generator 14 then generates address data from the set address data SA set on the basis of the address set data AS, and outputs the generated data to the buffer memory 13. At this time, the data processing controller 16 activates the write enable data WE with respect to the buffer memory 13. With this operation, the contents of the bytes designated by the address data input to the buffer memory 13 are updated to be replaced with the new header data HD input through the connector 12.

When updating of the header data HD in units of bytes inside the buffer memory 13 is completed, the data processing controller 16 controls the selector 15 such that the clocks YCK generated by the controller 16 are supplied to the address generator 14, and activates the out enable data OE with respect to the buffer memory 13. As a result, the header data HD are sequentially read out from the buffer memory 13 in accordance with address data generated by the address generator 14 on the basis of the clocks YCK.

At this time, the data processing controller 16 activates the write enable data WE with respect to the EEPROM 19, and generates the address data AD for designating the entire storage area of the header data HD in the EEPROM 19. As a result, all the header data HD which have undergone update processing and are stored in the buffer memory 13 are transferred to the EEPROM 19 to be written in its header data HD storage area in units of pages.

After all the header data HD is written in the EEPROM 19, the data processing controller 16 executes a write verify operation as follows. The controller 16 activates the out enable data OE with respect to the EEPROM 19, and outputs the address data AD for designating the entire storage area of the header data HD, thus reading out the written header data HD. The controller 16 then checks whether the readout header data HD coincide with the header data HD recorded in the buffer memory 13.

If the header data HD read out from the EEPROM 19 do not coincide with the header data HD recorded in the buffer memory 13, the data processing controller 16 transfers the header data HD from the buffer memory 13 to the EEPROM 19 again to write the data therein. This operation is repeated until the header data HD read out from the EEPROM 19 coincide with the header data HD recorded in the buffer memory 13, thus completing the process of writing the header data HD.

In contrast to this, if the data processing controller 16 determines that the input address data AD is image address data PAD, the controller 16 outputs the image address data PAD to the EEPROM 19, and activates the write enable data WE. Thereafter, the data processing controller 16 controls the select signal SEL to switch the selector 15 such that the clocks YCK generated by the controller 16 are supplied to the address generator 14.

At the same time, the data processing controller 16 activates the out enable data OE with respect to the buffer memory 13. As a result, the image data PD are sequentially read out from the buffer memory 13 in accordance with address data generated by the address generator 14 on the basis of the clocks YCK. The readout data is written in the EEPROM 19 in units of pages.

After the image data PD is written in the EEPROM 19, the data processing controller 16 executes a write verify operation as follows. The controller 16 activates the out enable data OE with respect to the EEPROM 19, and outputs the image address data PAD to read out the written image data PD. The controller 16 then checks whether the readout image data PD coincide with the image data PD recorded in the buffer memory 13.

If the image data PD read out from the EEPROM 19 do not coincide with the image data PD recorded in the buffer memory 13, the data processing controller 16 transfers the image data PD again from the buffer memory 13 to the EEPROM 19 to write the data therein. This operation is repeated until the image data PD read out from the EEPROM 19 completely coincide with the image data PD recorded in the buffer memory 13, thus completing the process of writing the image data PD.

The process of reading out the header data HD and the image data PD from the EEPROM 19 and outputting the readout data outside the memory card body 11 will be described next. Addresses at which data are read out from the electronic still camera main body CA side through the connector 12 are designated first. The designated addresses are supplied to the data processing controller 16, and it is discriminated whether the data are the header address data HAD or the image address data PAD.

Subsequently, the data processing controller 16 activates the out enable data OE and the write enable data WE with respect to the EEPROM 19 and the buffer memory 13 on the basis of the discrimination result. It also switches the selector 15 such that the clocks YCK generated by the controller 16 are supplied to the address generator 14, thereby reading out the header data HD and the image data PD from the header EEPROM 19 in units of pages, and writing the readout data in the buffer memory 13.

The data processing controller 16 then switches the selector 15 such that bus clocks BCK supplied from the electronic still camera main body CA side through the connector 12 are supplied to the address generator 14. As a result, data are read out from the buffer memory 13 in accordance with address data generated by the address generator 14 on the basis of the bus clocks BCK. The readout data is supplied to the electronic still camera main body CA through the connector 12, thus completing the process of reading out the header data HD and the image data PD.

According to the arrangement of the second embodiment described above, when an update request is made with respect to the header data HD characterized in that it has a small data amount and is mainly updated in units of bytes, all the header data HD are read out from the EEPROM 19 to be written in the buffer memory 13, and the header data HD are updated in units of bytes by a random access scheme inside the buffer memory 13. All the header data HD in the buffer memory 13 are written again in the EEPROM 19 in units of pages. Therefore, even with the EEPROM 19 which has a large storage capacity but cannot perform a data write/read operation in units of bytes, data can be easily written/read in units of bytes.

The third embodiment of the present invention will be described below. Since the digital data DA supplied from an electronic still camera main body CA to a memory card body 11 are formatted for the SRAM, the data are sequentially input to the memory card body 11. On the other hand, as described above, an EEPROM 19 can only perform a high-speed data write operation in units of pages, each consisting of several hundred bytes. In addition, the data write area of the EEPROM 19 must be erased before a data write operation, and verify processing is required after the data write operation.

For this reason, if the digital data DA sequentially input according to the SRAM format are to be directly written in the EEPROM 19, there may be no margin for setting the respective execution times, e.g., an erase time, a time taken to write data in units of pages, and a write verify time. As a result, a data write operation may not be performed.

For this reason, as shown in FIG. 4, a data processing controller 16 is designed to generate a ready/busy switching signal RDY/BSY which is set at H level to permit input of the digital data DA from the electronic still camera main body CA and is set at L level to inhibit an input operation. More specifically, a card enable signal CE, an address/data switching signal A/D, a read/write switching signal R/W, and bus clocks BCK are supplied from the electronic still camera main body CA to a connector 12. The card enable signal CE is set at H level when the memory card body 11 is selected. The address/data switching signal A/D is set at L level when data supplied to bus lines D0 to D7 is address data AD. When the data is digital data DA, the signal A/D is set at H level. The read/write switching signal R/W is set at L level and H level, respectively, in response to a data write request and a data read request to the EEPROM 19. The bus clocks BCK are synchronized with the address data AD.

The card enable signal CE, the address/data switching signal A/D, the read/write switching signal R/W, and the bus clocks BCK are supplied to the data processing controller 16. The data processing controller 16 generates the ready/busy switching signal RDY/BSY which is set at H level to permit input of the digital data DA from the electronic still camera main body CA and is set at L level to inhibit an input operation. The signal RDY/BSY is output to the electronic still camera main body CA through the connector 12.

Figures 1, 5:
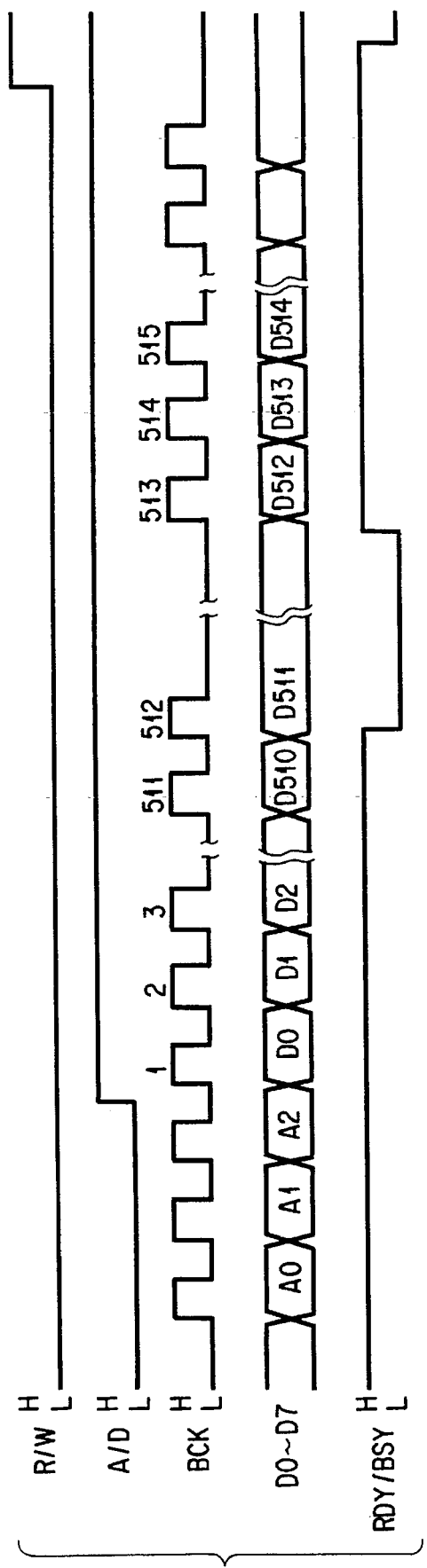
FIG. 1 is a view showing the merits and demerits of a SRAM versus an EEPROM card for comparison.
FIG. 5 is a timing chart for explaining the process of writing digital data in an EEPROM in the third embodiment.

FIG. 5 shows the detailed timings at which the digital data DA are written in the EEPROM 19. While the address/data switching signal A/D is at L level, the address data AD are supplied to the bus lines D0 to D7. At this time, the bus clocks BCK are generated in synchronism with the address data AD. In addition, the read/write switching signal R/W is set at L level to request a data write operation, and the ready/busy switching signal RDY/BSY is set at H level to permit an input operation.

In this state, when the address/data switching signal A/D is inverted to H level, and the data supplied to the bus lines D0 to D7 are converted into the digital data DA, 512 digital data D0 to D511, i.e., one-page digital data DA, are input to the data processing controller 16 together with 512 bus clocks BCK and are sequentially written in the buffer memory 13. When the one-page digital data DA, i.e., the data D0 to D511, are written in the buffer memory 13, the data processing controller 16 inverts the ready/busy switching signal RDY/BSY to L level in synchronism with the 512th bus clock BCK to inhibit input of data from the electronic still camera main body CA. At this time, the data processing controller 16 automatically erases the storage area of the EEPROM 19 in units of blocks.

Subsequently, under the control of the data processing controller 16, the one-page digital data DA from the data D0 to the data D511, of the digital data DA written in the buffer memory 13, are written, in units of pages, in the storage area of the EEPROM 19 which has been erased in units of blocks. During this write operation, the ready/busy switching signal RDY/BSY is kept at L level to maintain the input-inhibited state.

When the one-page digital data DA from the buffer memory 13 are completely written in the EEPROM 19 in this manner, the data processing controller 16 performs write verify processing with respect to the written data, inverts the ready/busy switching signal RDY/BSY to H level to permit an input operation, and performs control to write the digital data DA, i.e., data D513 and subsequent data, in the buffer memory 13. Subsequently, a similar operation is repeated to perform a page write operation with respect to the EEPROM 19.

According to the third embodiment shown in FIG. 4, when the one-page digital data DA from the data D0 to the data D511 are written in the buffer memory 13, the ready/busy switching signal RDY/BSY is immediately set at L level to inhibit an input operation. In this input-inhibited state, block erase processing of the EEPROM 19, page write processing, and write verify processing are performed. Therefore, even the sequentially input digital data DA can be written in the EEPROM 19 with a sufficient margin, allowing the memory card to be used in the SRAM-card-like manner.

The fourth embodiment of the present invention will be described below. A page write type EEPROM 19 as in the EEPROM described above is designed such that a write operation is not started until one-page digital data DA constituted by 512 bytes are completely input. For this reason, if, for example, an input operation is ended before the input digital data DA reaches an amount corresponding to one page, the input data is not written in the EEPROM 19. That is, an input operation is ended before the it can be detected that the amount of input digital data DA reaches the amount corresponding to one page where such detection is made by the absence of the input bus clock BCK. However, it is almost impossible to detect the end of input data on the basis of only the above-mentioned detection.

For this reason, data end detection is performed by using a pattern which never occurs in a normal write operation. An example of such a pattern, is a pattern in which the write mode is shifted to the read mode without having performed address designation. This pattern is unique because the write mode is normally shifted to the read mode after an address is designated, thereby designating a location from which data is to be read out. If this pattern, which never occurs in a normal operation, is detected, a data end is determined, and a ready/busy switching signal RDY/BSY is set at L level to inhibit an input operation. Upon detection of the data end, a data processing controller 16 adds dummy data as complementary data to one-page data and performs control to write the resultant data in the EEPROM 19.

When data update processing is to be performed with respect to the EEPROM 19, an erase operation must always be performed. In addition, the minimum data write unit of the EEPROM 19 is a page of several hundred bytes, and the minimum erase unit is a block of several kbytes, which is larger than a page. Digital image (including speech) data are mainly recorded in the EEPROM 19 used for a memory card body 11 connected to an electronic still camera main body CA. Such data are called packet data. As shown in FIG. 6, packet data are written in the storage area of the EEPROM 19 in units of blocks.

One-page packet header data as management information (a date, a title, and the like) unique to each packet data is added thereto. For this reason, if, for example, the title of packet data is to be changed, its packet header data is erased so that it can be replaced with new data. However, since the minimum erase unit is a block, if the packet header data is erased, the necessary packet data is erased as well as the packet header data. Consequently, update processing of only packet header data cannot be performed.

Figure 7:
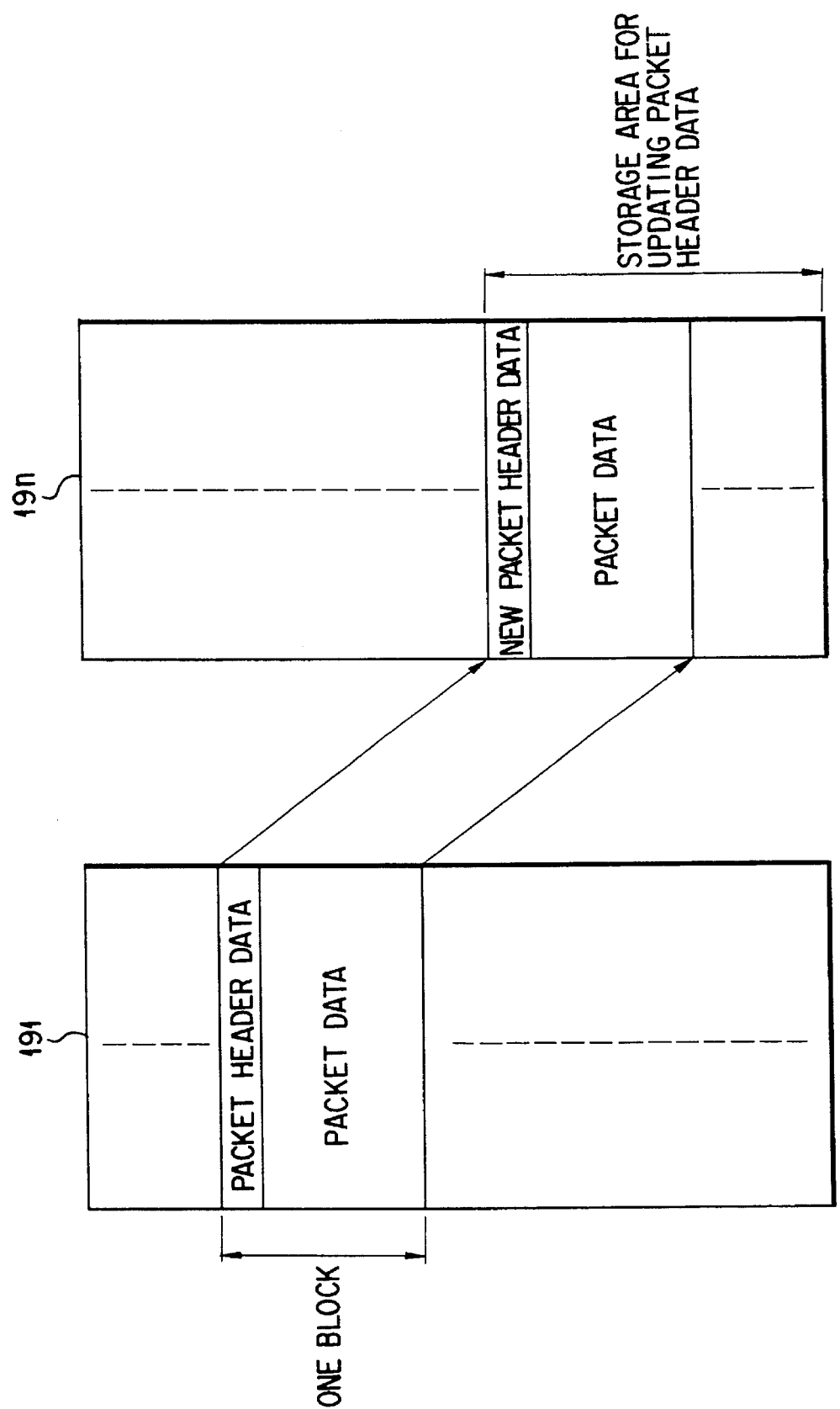
FIG. 7 is a view for explaining a memory card apparatus according to the fourth embodiment of the present invention.

As shown in FIG. 7, therefore, a storage area for packet header data update processing is set in an EEPROM chip 19n of a plurality of EEPROM chips 191 to 19n constituting the EEPROM 19. Assume that a request is generated to update the packet header data of predetermined packet in the EEPROM chip 191. In this case, the data processing controller 16 searches for a one-block free area in the packet header data update storage area of the EEPROM chip 19n.

Subsequently, the data processing controller 16 writes new packet header data, output from the electronic still camera main body CA, in the free area searched in the EEPROM chip 19n in units of pages. After this new packet header data is completely written, the data processing controller 16 performs control to transfer the packet data, stored in the EEPROM chip 191, into the EEPROM chip 19n, in units of pages, following the previously written new packet header data. Thereafter, the packet data transferred from the EEPROM chip 191 is erased in units of blocks under the control of the data processing controller 16, and the corresponding area is preserved as a new packet header data update storage area.

According to the fourth embodiment shown in FIG. 7, when updating of packet header data is requested, a one-block free area is searched in the packet header data update storage area of the EEPROM chip 19n. After new packet header data is written in this free area in units of pages, packet data of the EEPROM chip 191 is transferred into the EEPROM chip 19n, in units of pages, following the previously written new packet header data. Therefore, packet header data can be updated in units of pages in spite of the fact that the EEPROM 19 can only perform erase processing in units of blocks.

The fifth embodiment of the present invention will be described below. Data update processing with respect to an EEPROM 19 is performed as follows. New data is written in a storage area in which update processing is to be performed. At this time, the next one-page portion in the storage area is automatically erased to allow the next one-page data to be written therein. This operation is repeated.

Assume that one-page data consists of 512 bytes. In this case, if input data ends at the 300th byte, the next page is not erased. However, if input data ends exactly at the 512th byte, the next page is automatically erased in spite of the fact that there is no data left to be written. That is, data which need not be erased is unnecessarily erased.

Figure 8:
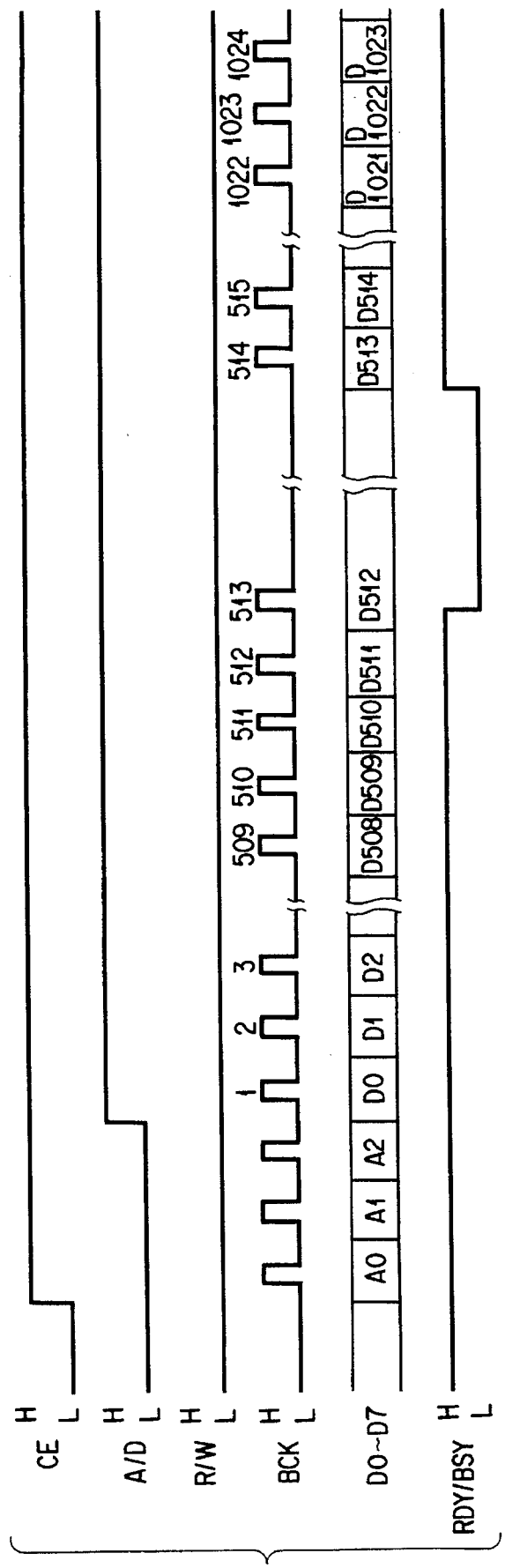
FIG. 8 is a timing chart for explaining a memory card apparatus according to the fifth embodiment of the present invention.

For this reason, the timings at which digital data DA are written in the EEPROM 19 are controlled, as shown in FIG. 8. More specifically, when a chip enable signal CE is set at H level to designate a memory card body 11, an address/data switching signal A/D is set at L level, and address data AD are supplied to bus lines D0 to D7. At this time, bus clocks BCK are generated in synchronism with the address data AD. In addition, a read/write switching signal R/W is set at L level to request a data write operation, and a ready/busy switching signal RDY/BSY is set at H level to permit an input operation.

In this state, when the address/data switching signal A/D is inverted to H level, and the data supplied to the bus lines D0 to D7 are converted into digital data DA, 512 data from data D0 to data D511, i.e., one-page digital data DA, are input to a data processing controller 16 together with 512 bus clocks BCK. The digital data DA are sequentially written in a buffer memory 13. After the one-page digital data DA from the data D0 to the data D511 are written in the buffer memory 13, the data processing controller 16 waits until the 513th bus clock BCK is generated, and checks whether data D512 of the digital data DA which corresponds to the 513th bus clock BCK is present.

If the data D512 of the digital data DA which corresponds to the 513th bus clock BCK is present, the data processing controller 16 writes the data D512 of the digital data DA in the buffer memory 13, and inverts the ready/busy switching signal RDY/BSY to L level in synchronism with the 513th bus clock BCK to inhibit input of data from the electronic still camera main body CA. At this time, the data processing controller 16 automatically erases a one-page portion of the storage area of the EEPROM 19 to write one-page digital data DA consisting of the data D512 and the subsequent data.

After this operation, the data processing controller 16 performs control to write one-page digital data DA from the data D0 to the data D511, of the digital data DA written in the buffer memory 13, in the page-erased storage area of the EEPROM 19 in units of pages, and keeps the ready/busy switching signal RDY/BSY at L level during this write operation, thus maintaining the input-inhibited state.

When the one-page digital data from the buffer memory 13 are completely written in the EEPROM 19, the data processing controller 16 sets the ready/busy switching signal RDY/BSY at H level to permit an input operation, performs control to write the digital data DA from the data 513 and the subsequent data in the buffer memory 13 following the digital data DA previously written therein. Subsequently, a similar operation is repeated to perform page write processing with respect to the EEPROM 19.

According to the fifth embodiment shown in FIG. 8, immediately after the one-page digital data DA from the data D0 to the data D511 are written in the buffer memory 13, the ready/busy switching signal RDY/BSY is set at L level, and the data processing controller 16 waits until the 513th bus clock BCK corresponding to the (one page+1)th clock is generated. It is then checked whether the data D512 of the digital data DA is present. If the data is present, the ready/busy switching signal RDY/BSY is set at L level to page-erase the storage area of the EEPROM 19 so as to allow the one-page digital data DA from the data D512 and the subsequent data to be written therein. Therefore, even if the digital data DA to be written in the EEPROM 19 ends at the 512th byte, the next page of the EEPROM 19 is not automatically erased, thereby preventing the inconvenience that the digital data DA which need not be erased is unnecessarily erased.

Figure 9:
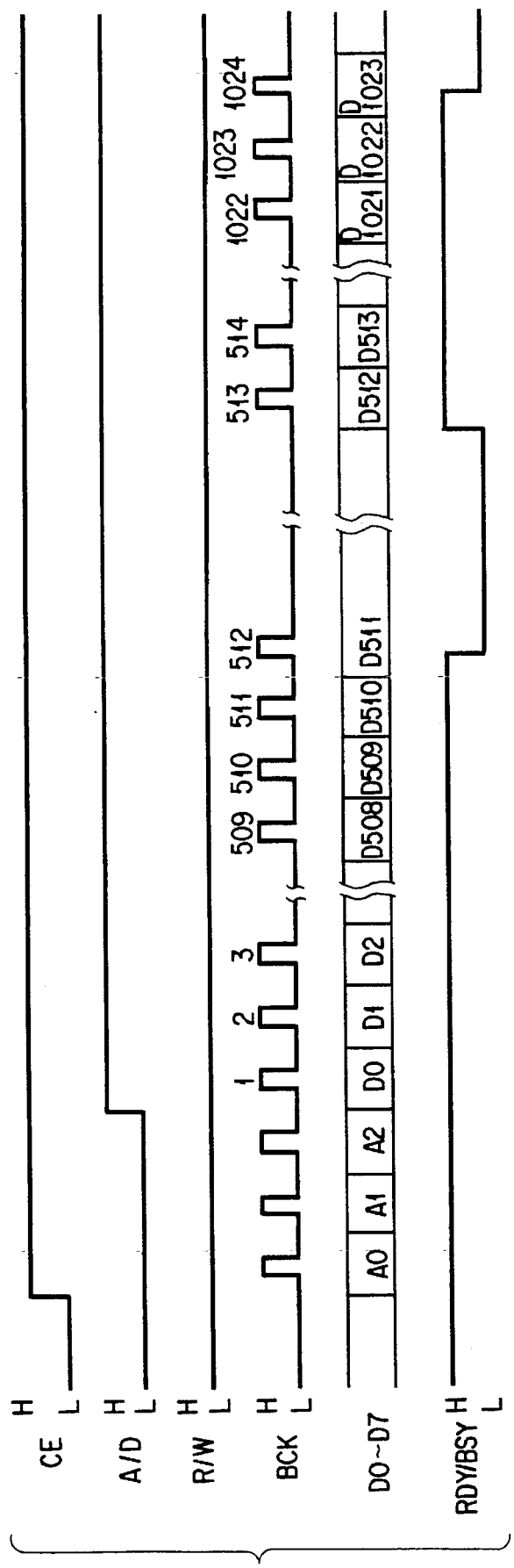
FIG. 9 is a timing chart for explaining an operation in a case wherein the fifth embodiment is not used.

Assume the ready/busy switching signal RDY/BSY is set at L level to erase the next page of the EEPROM 19, as shown in FIG. 9, without checking whether the data D512 of the digital data DA corresponding to the 513th bus clock which corresponds to the (one page+1)th clock. In this case, if the digital data DA to be written in the EEPROM 19 ends at the 512th byte, the next page of the EEPROM 19 is automatically erased. As a result, the digital data DA which need not be erased are unnecessarily erased.

The sixth embodiment of the present invention will be described below. If the number of times data update processing is performed in an EEPROM 19 exceeds a predetermined number, the memory cells rapidly deteriorate, and data write errors tend to occur. More specifically, the EEPROM 19 has been developed as a memory for storing program data and allows update processing when the program is upgraded, but is not designed to allow a large number of data update operations. If, however, the EEPROM 19 is used as a substitute for an SRAM, it is apparent that updating of data is frequency performed. Therefore, it is inevitable that the rate of occurrence of write errors will greatly increases.

In the prior art, a write error is determined if data is not properly written even after the above-described verify processing is performed a predetermined number of times. According to the prior art, even if a write error occurs in part of the EEPROM 19, the overall memory card incorporating the EEPROM 19 is treated as a defective product, resulting in poor efficiency and an economical disadvantage.

For this reason, as shown in FIG. 10, a remedy area is set in the EEPROM 19. In the remedy area, data which cannot be written in the data area is written. More specifically, the EEPROM 19 has a storage area defined by address 0000 to address XXXX. This storage area is divided into a plurality of blocks 1 to M (one block is several kbytes), each having a predetermined capacity as the minimum unit for data processing. Of these blocks, blocks 1 to N constitute a data area in which normal data are recorded, in/from which data can be arbitrarily written/read in units of blocks by externally designating addresses and repeating data write/read operation processing in units of pages, each consisting of several hundred bytes.

Blocks N+1 to M constitute the remedy area, in which data which cannot be written in the data area due to a write error is written. Direct external access to the remedy area is inhibited. Data write/read processing with respect to the remedy area is performed under the control of a data processing controller 16.

FIG. 11 shows a remedy area management table set in the EEPROM 19. In this table, block numbers N+1 to M in the remedy area are arranged in a one-to-one correspondence with the start addresses of blocks corresponding to write errors in the data area. Before a start address is written, "0000" is set in the corresponding portion. In the case shown in FIG. 11, blocks N+1 to Y−1 are already used to remedy data which have suffered from write errors, and start addresses AAAA to DDDD of blocks corresponding to write errors in the data area are respectively recorded.

A case wherein a write error is caused when data is written in block X in the data area will be described below. If a coincidence between data cannot be obtained after write verify processing is performed with respect to block X a predetermined number of times, the data processing controller 16 determines that a write error is caused in block X. The data processing controller 16 then searches the management table shown in FIG. 11 for a free block in the remedy area.

In this case, since a block having block number Y is free, the data processing controller 16 selects block Y in the remedy area, and writes the data, which cannot be written in block X, in block Y. If the write processing is validated by write verify processing, the data processing controller 16 writes start address YYYY of block X in the portion corresponding to block number Y, thus completing the remedy processing.

A data read operation of the EEPROM 19 is performed as follows. The data processing controller 16 collates the start address of a block, in the data area, to which a read request is externally made by designating an address, with all the start addresses written in the management table. If a coincidence is determined, the data processing controller 16 performs control to read data from a block, in the remedy area, which corresponds to the coincident start address.

A data erase operation of the EEPROM 19 is performed as follows. Similar to the data read operation, the data processing controller 16 collates the start address of a block, in the data area, to which an erase request is externally made by designating an address, with all the start addresses written in the management table. If a coincidence is determined, the data processing controller 16 performs control to erase data from a block, in the remedy area, which corresponds to the coincident start address.

According to the sixth embodiment shown in FIG. 10, if write errors occur in some blocks in the data area, data which cannot be written in the error blocks are written in free blocks, in the remedy area, which are searched from the management table. Therefore, the EEPROM 19 in which write errors occur partly can be continuously used and hence is economically advantageous and practical.

Since the remedy area is also present in the EEPROM 19, write errors may occur in blocks N+1 to M. In such a case, the data processing controller 16 records a use inhibiting flag at a block number, in the management table, at which a write error occurs, in place of a start address. For this use inhibiting flag, for example, address 1111 is selected as an address which does not exist in the data area. If a write error is caused in the searched free block Y in the remedy area, the data processing controller 16 searches the management table for the next block Y+1, and performs control to perform a data write operation.

In addition, if a write error occurs in a block in the data area while the remedy area is full, a free block in the data area can be used as a remedy block. In this case, as shown in FIG. 12, the management table is designed such that all block numbers 1 to M in the data and remedy areas are arranged in a one-to-one correspondence with the start addresses of blocks corresponding to write errors in the data area. In this table, "1111" is recorded, as a use inhibiting flag, at each block number corresponding to blocks used to record normal data in the data area, while "0000" is recorded at each block number corresponding to a block, in the data area, in which no data is recorded yet.

A case wherein the remedy area is full, and a write error occurs in block X in the data area will be described below. If the data processing controller 16 determines that a write error is caused in block X, the controller 16 searches the management table for a free block among blocks N+1 to M in the remedy area. If the data processing controller 16 determines that no free block is present in the remedy area, the controller 16 searches the management table for a free block among blocks 1 to N in the data area.

In this case, since block N–1 is free, the data processing controller 16 writes the data, which cannot be written in block X, in block N–1. If the write processing is validated by verify processing, start address YYYY of block X is written at block number N–1 in the management table, thus completing the remedy processing.

The seventh embodiment of the present invention will be described below. In the prior art, when a write error is caused in the EEPROM 19, it cannot be discriminated whether the error is a so-called verify error caused when data update processing is performed a large number of times, or is caused by defects in the manufacture of the EEPROM 19 or its mechanical destruction. In addition, if data update processing is intensely and frequently performed with respect to a specific storage area in the EEPROM 19, a verify error is caused within a very short period of time.

Figure 13:
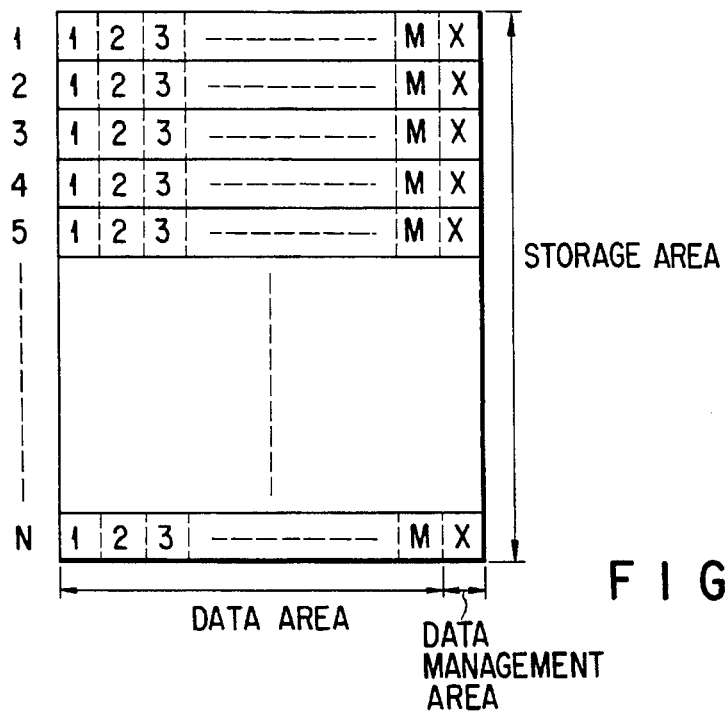
FIG. 13 is a view for explaining a memory card apparatus according to the seventh embodiment of the present invention.

For this reason, as shown in FIG. 13, a data management area in which the management information of data recorded in the data area is recorded is set in each of blocks 1 to N in the EEPROM 19. More specifically, the storage area of the EEPROM 19 is divided into a plurality of blocks 1 to N (one block consists of several kbytes), each having a predetermined capacity as the minimum unit for a data erase operation. Each of blocks 1 to N is divided into a plurality of pages 1 to M, each having a predetermined capacity as the minimum unit for data write/read processing. Pages 1 to M constitute a data area in which data is recorded, whereas page X constitutes a data management area in which the management information of the data recorded in the data area is recorded.

Data can be arbitrarily written/read in/from the EEPROM 19 in units of blocks under the control of the data processing controller 16 by externally designating addresses and repeating data write/read operation processing in units of pages, each consisting of several hundred bytes.

In page X constituting the data management area of each of blocks 1 to M, the number of times data is recorded (a data recording count) in each block to which page X is belongs is recorded under the control of the data processing controller 16. This data recording count is updated under the control of the data processing controller 16 when an erase operation is executed with respect to each of blocks 1 to M.

Assume that data already written in block 5 is to be updated. When address data designating block 5 is externally input through a connector 12, the data processing controller 16 reads out the data management information recorded in page X of block 5, and records it in a buffer memory 13.

The data processing controller 16 erases the contents of block 5, and increments the data recording count, of the data management information recorded in the buffer memory 13, by one. Thereafter, the data processing controller 16 writes data, externally input through the connector 12, in pages 1 to M of block 5 in the EEPROM 19, and transfers the updated data management information from the buffer memory 13 to the EEPROM 19 to write it in page X of block 5, thus completing the data update processing with respect to block 5.

According to the seventh embodiment shown in FIG. 13, in page X constituting the data management area of each of blocks 1 to N in the storage area of the EEPROM 19, a data recording count with respect to each of blocks 1 to N to which page X belongs is recorded. Therefore, even if a write error occurs in any one of blocks 1 to N, the data processing controller 16 can easily determine the type of error on the basis of the data recording count recorded in page X belonging to the error block in the following manner. If the data recording count is larger than a predetermined count, a verify error is determined. Otherwise, it is determined that the error is caused by defects in the manufacture of the EEPROM 19 or its mechanical destruction.

In addition, assume that a write request is generated to write data in one of a plurality of erased blocks. In this case, the data processing controller 16 reads out the data recording counts recorded in pages X of the plurality of blocks, and can perform control to write the data in one of the blocks which has the smallest data recording count so as to average the data recording counts in the respective blocks 1 to N. With this operation, the data processing controller 16 can prevent intensive data update processing of a specific block and hence can suppress the occurrence of verify errors. Furthermore, even if a data erase count is recorded in page X as well as a data recording count, similar effects can be obtained.

The eighth embodiment of the present invention will be described below. In general, when data, e.g., computer data or image data, is to be recorded in a recording medium such as a semiconductor memory, it is necessary to record header data indicating the attributes of the data as well. This header data is characterized in that it is updated very frequently and is required to have high reliability. For this reason, error detection/correction processing and the like of header data must be performed in the processing of the semiconductor memory chip itself or software.

In any error correction processing, an error can be detected by polling in the process of writing header data in the semiconductor memory. However, in the process of reading out the header data from the semiconductor memory, determination on the presence/absence of an error, substitute processing with respect to an error, and the like must be performed.

A case wherein the above-described EEPROM 19 capable of data write/read processing in units of bytes is used for a header data storage area will be described below with reference to FIG. 14. Assume that errors occur at random in units of bytes.

Figure 14:
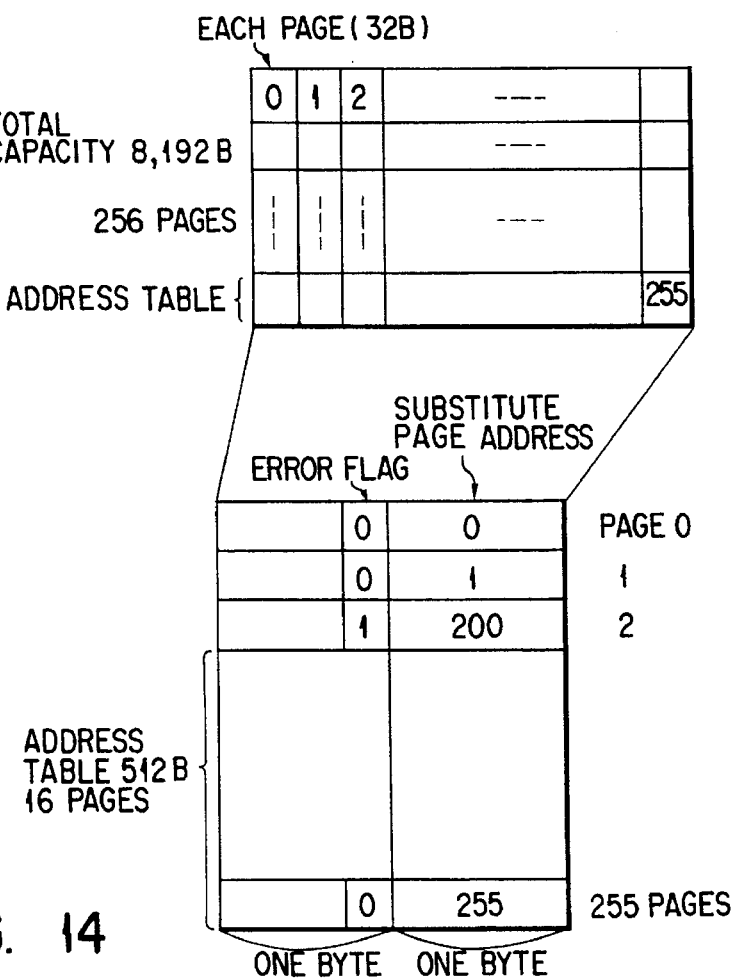
FIG. 14 is a view for explaining the arrangement of a header data storage area in an EEPROM.

FIG. 14 shows the format of the header data area. The total area consists of 8 kbytes (8192 bytes) and is divided into 256 pages, each constituted by 32 B (bytes). In each page, a 1-bit error flag indicating the presence/absence of an error is written. In addition, in a page in which an error occurs, the address of a substitute page is written to perform substitute processing for writing data, which is to be written in the error page, in the substitute page.

In this case, since each page requires 1 byte for an area for recording a substitute page address, and an error flag consists of 1 byte, a total of 2 bytes are used per page. Since the total number of pages is 256, an address table corresponding to 512 bytes (16 pages) is required as a whole.

As is apparent, since normal header data cannot be written in the storage area required for this address table, the total storage area is reduced by about 6%. Furthermore, in this case, one page is constituted by 32 bytes. If, however, one page is constituted by 16 bytes, 1024 bytes, i.e., twice the number of bytes in the above-described case, are required for the storage area of an address table. Consequently, the storage area which cannot be used to write normal header data is increased to reduce the header data storage area.

In addition, in order to perform substitute processing, a storage area used for this processing must be prepared in advance. If this storage area is small, and substitute processing is performed many times with respect to pages which are frequency accessed, no substitute destinations may be left. In this case, in spite of the fact that the large-capacity data storage area still allows update processing, since update processing with respect to the small-capacity header data storage area is inhibited, the memory cannot be used as a whole.

For this reason, the header data storage area of the EEPROM 19 is formatted, as shown in FIG. 15A. More specifically, the header data storage area has a total capacity of 8,192 bytes and is divided into 256 pages, each having a page capacity of 32 bytes. A storage area for recording error flags corresponding to the 256 pages requires 256 bits=32 bytes, which correspond to one page. In this case, the last page is ensured as the error flag storage area.

FIG. 15B is an enlarged view of the error flag storage area. In the initial state, "0"s are written, as error flags for all the pages, in all the bits of the error flag storage area. If an error occurs in a given page, the bit corresponding to the page is updated to be "1". Data which is to be written in an error page is written in a predetermined substitute page. In this case, as indicated by the enlarged view of FIG. 15C, the address of the substitute destination page is written in each byte of the error page.

Figure 16:
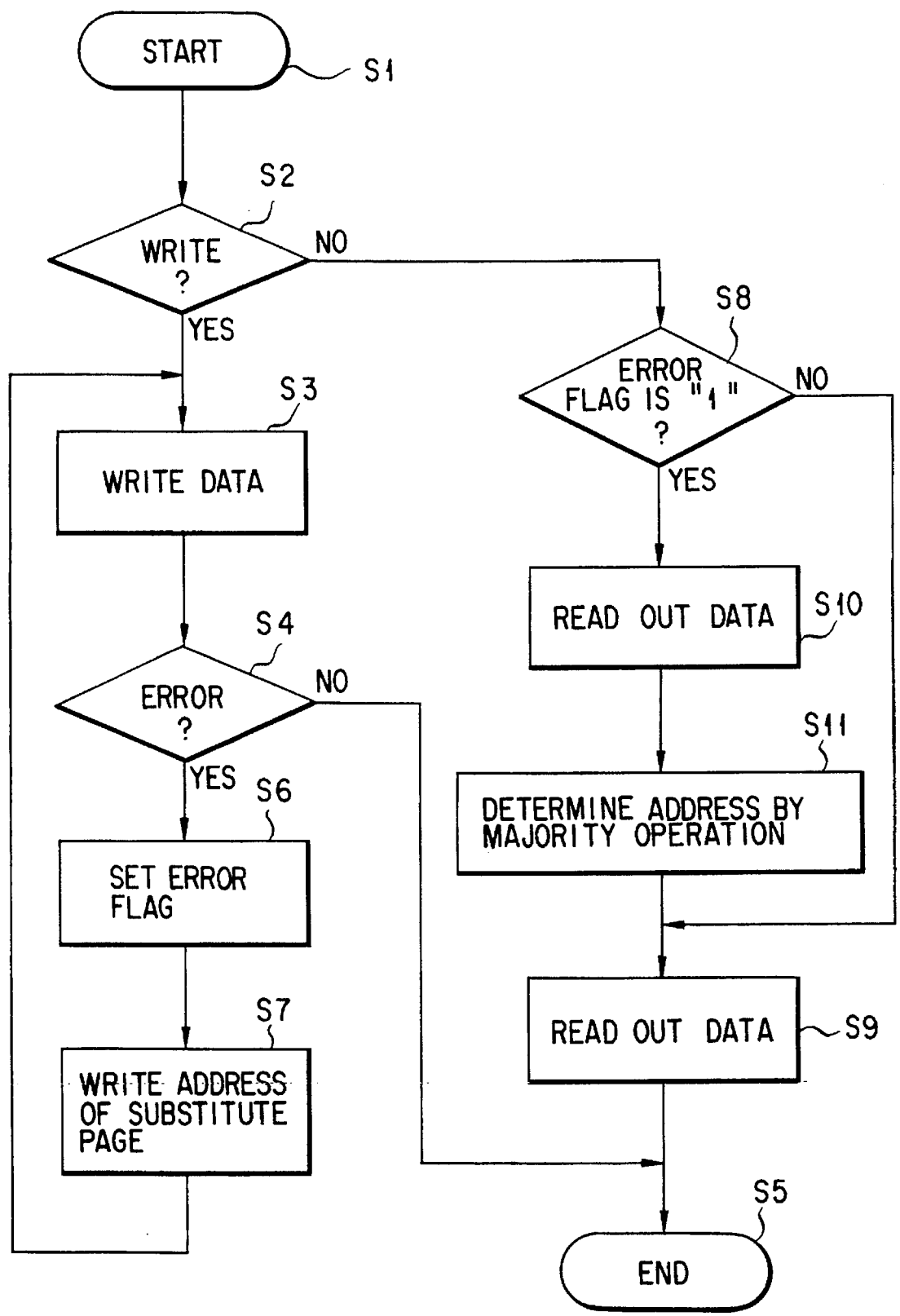
FIG. 16 is a flow chart for explaining an operation of the eighth embodiment.

FIG. 16 shows an operation to be performed when a write error occurs in one of the pages of the header data storage area of the EEPROM 19. When the routine is started (step S1), the data processing controller 16 checks in step S2 whether a request for write processing with respect to the EEPROM 19 is generated. If a request is generated (YES in step S2), polling is performed at the time of data write operation in step S3. In step S4, the data processing controller 16 checks whether an error is caused.

If no error is caused (NO in step S4), the data processing controller 16 ends the write processing (step S5). If, for example, as shown in FIG. 15A, an error is caused in the second page (YES in step S4), the data processing controller 16 updates the bit in step S6, in the error flag area shown in FIG. 15B, which corresponds to the second page to replace it with "1", thus setting an error flag.

If an error is caused in any page, and the corresponding error flag is kept at "1". For this reason, the maximum update count of the error flag area is 8, which is much smaller than the generally guaranteed update count (10,000 or more) of the EEPROM 19. Therefore, it can be considered that no errors occur in this area.

In step S7, the data processing controller 16 searches for a free substitute page, and writes the address of the page (page 200 in FIG. 15A) in all the bytes (32 bytes) for page 2, as shown in FIG. 15C. In this case, each address is constituted by 1 byte. However, even if each address is constituted by 2 bytes, a similar operation can be applied. In this case, it is clear that an address cannot be written in a byte in which a write error occurs. However, this will be neglected.

The flow finally returns to step S3, in which the data processing controller 16 writes the header data, which is to be initially written, in the substitute page (page 200). If an error is determined again in step S4, the data processing controller 16 repeats the processing in steps S6 and S7, thus performing substitute processing. If no error is detected, the write processing and the error page substitute processing are completed.

If a request for read processing with respect to the EEPROM 19 is determined instead of a write request (NO in step S2), the data processing controller 16 refers to the error flag area and checks in step S8 whether the error flag of the page for which the read request is generated is "1". If the error flag is not "1" (NO in step S8), the data processing controller 16 reads out the data of the page in step S9, and ends the read processing (step S5).

If the flag of the page for which the read request is generated is "1" (YES in step S8), the data processing controller 16 determines in step S10 that an error is caused in the page, and reads out substitute addresses written in all the bytes of the error page. In step S11, the data processing controller 16 compares all the substitute addresses with each other to determine an address by majority. In this case, all the data need not be read out. In step S9, the data processing controller 16 finally reads out header data from the substitute page in accordance with the determined substitute address, and ends the read processing (step S5).

Figure 15:
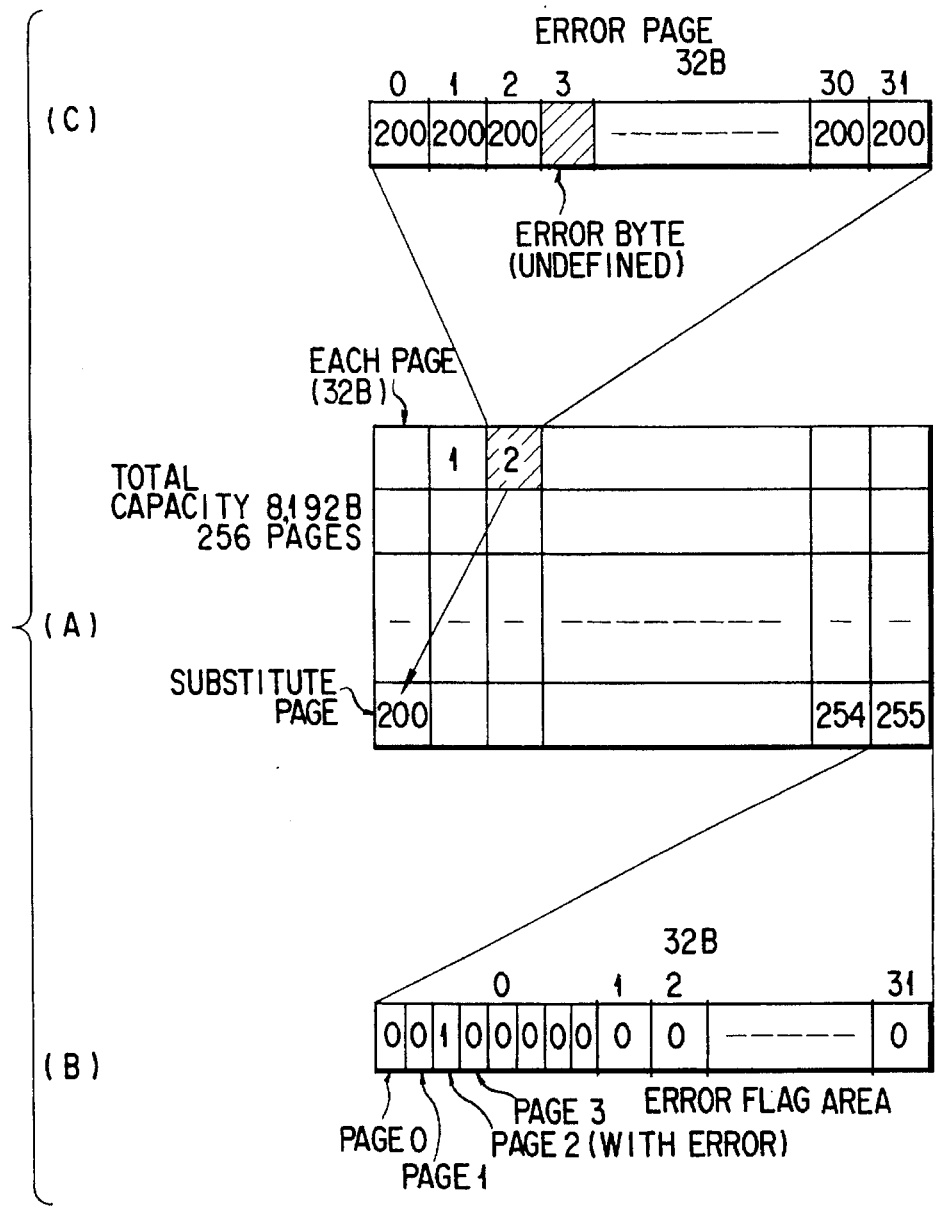
FIGS. 15A to 15C are views for explaining a memory card apparatus according to the eighth embodiment of the present invention.

According to the eighth embodiment shown in FIG. 15, the storage area, in the EEPROM 19, required for substitute processing for error pages requires only one page (32 bytes) for storing error flags, but an address table area need not be independently ensured. Therefore, the error flag storage area can be reduced by 15 pages (480 bytes) as compared with the storage area shown in FIG. 14, and the ratio of the storage area to the total storage area can be suppressed to about 0.4%. The saved storage area can be used as a write area for normal header data or can be used as, e.g., substitute pages, thereby solving the problem that the overall memory cannot be used because the substitute pages to be accessed are reduced, and update processing with respect to the small-capacity header storage is inhibited.

Figure 17:
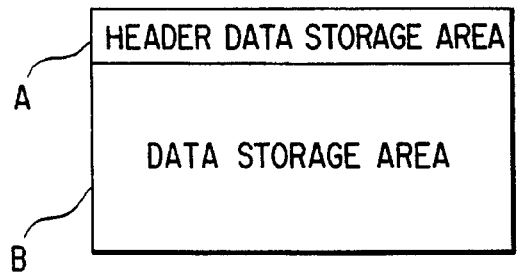
FIG. 17 is a view for explaining the memory space of a memory card.
Figure 18:
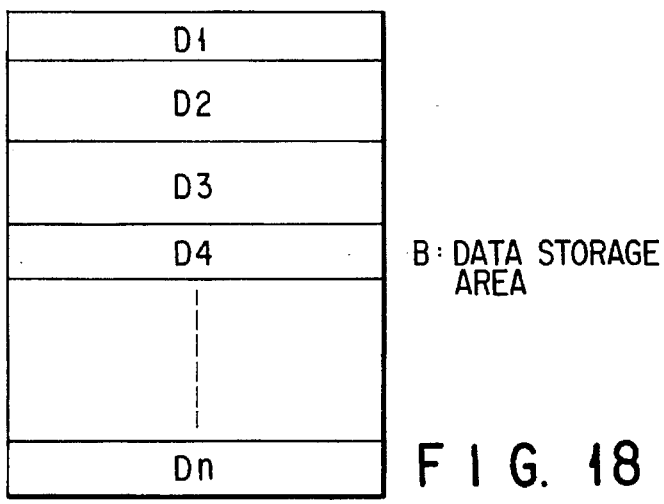
FIG. 18 is a view for explaining the arrangement of a data storage area in the memory space in FIG. 17.

The ninth embodiment of the present invention will be described below. Consider the erase mode of an EEPROM 19. The memory space of an SRAM card can be divided into a header data storage area A and an information (image) data storage area B, as shown in FIG. 17. Header data HD is management data for mainly managing information data. As shown in FIG. 18, a plurality of data D1 to Dn are stored in the information data storage area B.

Figure 19:
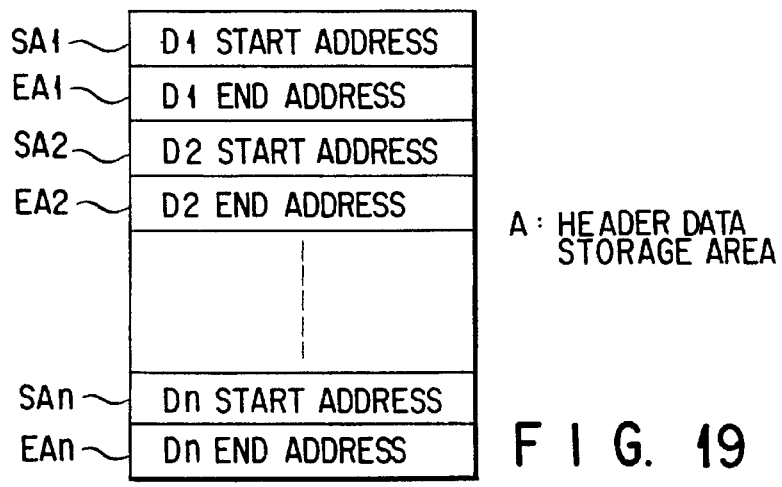
FIG. 19 is a view showing the arrangement of a header storage area in the memory space in FIG. 17.

In the header data storage area A, as shown in FIG. 19, start addresses SA1 to SAn and end addresses EA1 to EAn for designating the storage locations of information data D1 to Dn are stored. Information data in the data storage area B can be accessed by referring to addresses in the header data storage area A.

Figure 20:
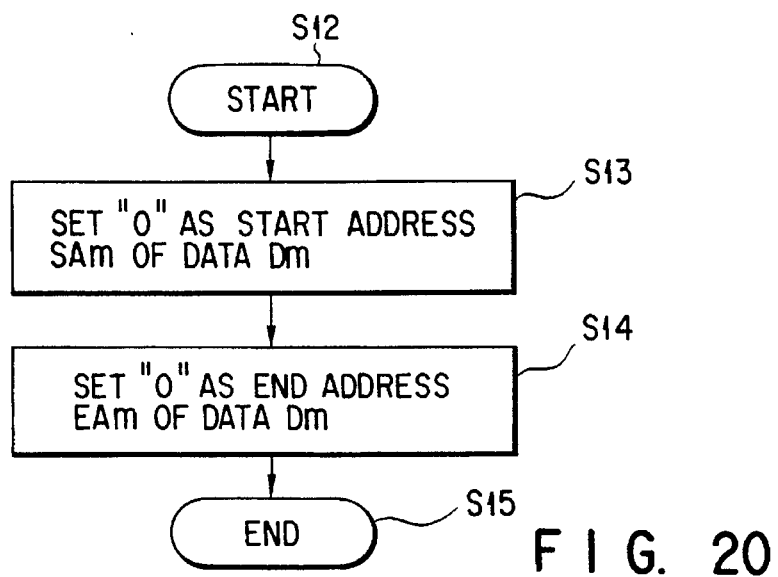
FIG. 20 is a flow chart for explaining an erase command output from the electronic still camera main body side to the memory card.

Assume that a command is issued from an electronic still camera main body CA to erase information data Dm. According to the SRAM card, as shown in FIG. 20, when the erase routine is started (step S12), start address SAm of the data Dm is set to be "0" in the header data storage area A in step S13. In step S14, end address EAm of the data Dm is set to be "0". with this operation, the routine is ended (step S15). That is, the information data Dm in the data storage area B is not erased because the SRAM is capable of overwrite processing.

If, therefore, the same erase routine as that of the SRAM card is applied to the EEPROM card, the data Dm is left in the information data storage area B of the EEPROM 19. However, since a rewrite operation of the EEPROM 19 cannot be performed unless previously recorded data is erased, the EEPROM card has the write routine shown in FIG. 21. When the routine is started (step S16), the storage area of the data Dm in the information data storage area B is erased in step S17. In step S18, new data Dm' is written in the erased storage area. Thereafter, in steps S19 and S20, start and end addresses SAm' and EAm' of the new data Dm' are respectively written in the header data storage area A. With this operation, the routine is ended (step S21).

As described above, when an information data write operation of the EEPROM card is to be performed, erase processing must always be performed. However, as in an electronic still camera apparatus, processing of image data as information data requires a storage capacity of 96 kbytes even if data is compressed to ⅛. If data in such a large-capacity memory are erased in units of blocks, it takes about 0.3 msec. That is, the ratio of the time required for this erase processing to the total time required for write processing is very high. For this reason, if the EEPROM 19, which takes more time to perform write processing than the SRAM, is used for a memory card body 11, the time required to perform a write operation of the card is prolonged.

Figure 22:
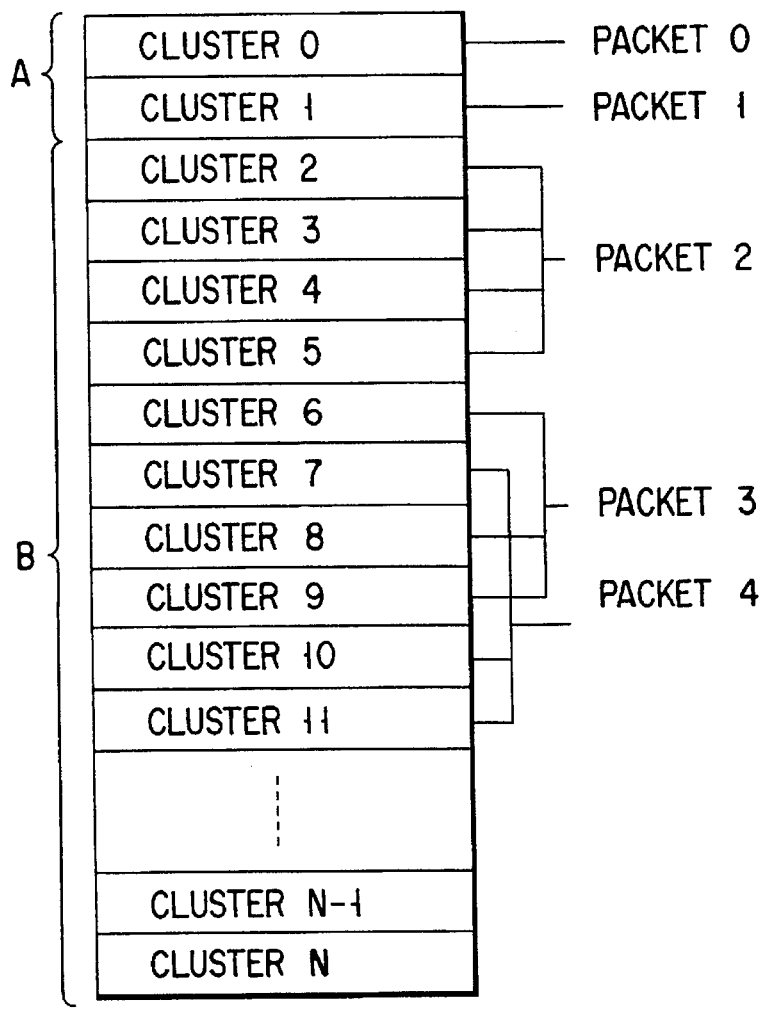
FIG. 22 is a view for explaining the memory space of an EEPROM in a memory card apparatus according to the ninth embodiment of the present invention.
Figure 23:
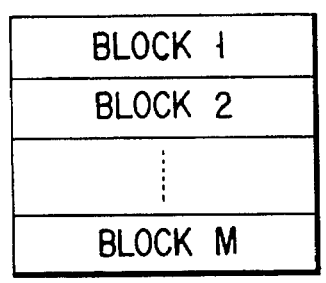
FIG. 23 is a view for explaining the arrangement of clusters in the ninth embodiment.

In the ninth embodiment, therefore, the time required to write data in the EEPROM 19 is shortened in the following manner. The memory space of the EEPROM 19 is divided into a header data storage area A and an image data storage area B, as shown in FIG. 22. The memory space is formatted in units of clusters. Referring to FIG. 22, clusters 0 and 1 constitute the header data storage area A, and clusters 2 to N constitute the image data storage area B. Each cluster is constituted by M (a fixed value of 1 or more) erase blocks, as shown in FIG. 23.

Figure 24:
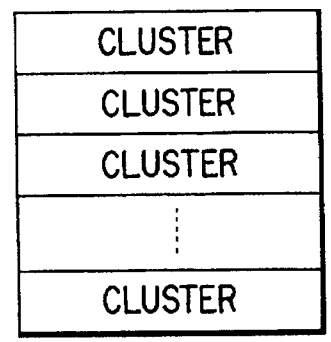
FIG. 24 is a view for explaining the arrangement of packets in the ninth embodiment.

Data are processed in units of packets, each of which is constituted by L (an arbitrary value of 1 or more) clusters, as shown in FIG. 24. Referring to FIG. 22, packets 0 and 1 are header data constituted by clusters 0 and 1; packet 2, image data constituted by clusters 2, 3, 4, and 5; packet 3, image data constituted by clusters 6, 8, and 9; and packet 4, image data constituted by clusters 7, 10, 11.

Figure 25:
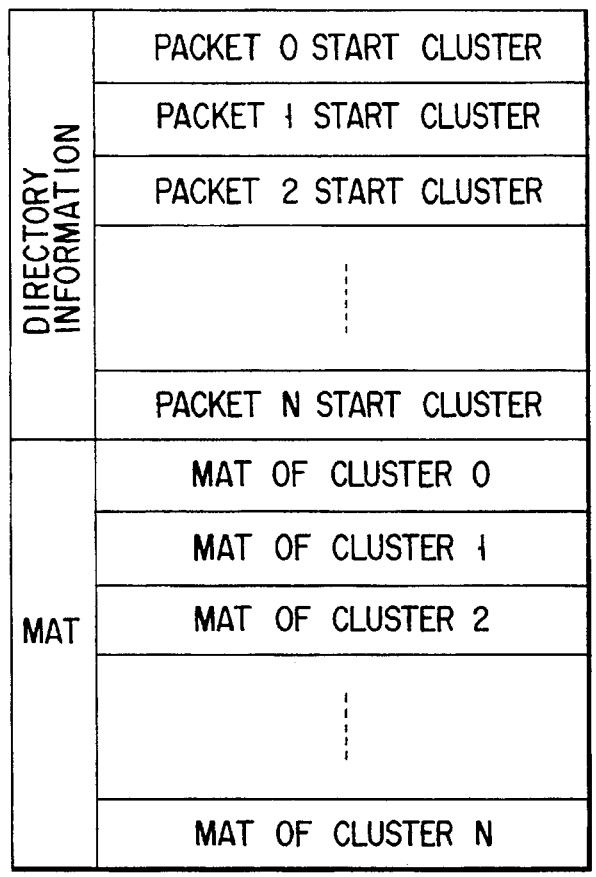
FIG. 25 is a view for explaining the arrangement of a header data storage area in the memory space in the ninth embodiment.

FIG. 25 shows part of the header data storage area A. The area A includes a directory information area and an MAT (memory allocation table) area. The start cluster numbers of the respective packets are managed in the directory information area. The MATs of the respective clusters are managed in the MAT area. Succeeding cluster numbers are written in the MAT area. In this case, each cluster chain end is represented by, e.g., "FFh", and each unused cluster is represented by, e.g., "00h".

As an example, packet 3 in FIG. 22 will be considered. The start cluster number of packet 3 is 6. The MAT of cluster 6 is 8; the MAT of cluster 8, 9; and the MAT of cluster 9, FFn. It is thus apparent that in packet 3, clusters 6, 8, and 9 are arranged in the order named.

Assume that when image data read out from the EEPROM 19 is reproduced by, e.g., a TV receiver, it is determined that the reproduced image is not necessary. In this case, if the unnecessary image data is erased, a rewrite operation can be performed with respect to the erased area. For this purpose, the electronic still camera main body CA includes unnecessary data processing mode for designating which data is unnecessary. This unnecessary data processing mode will be described below.

Figure 26:
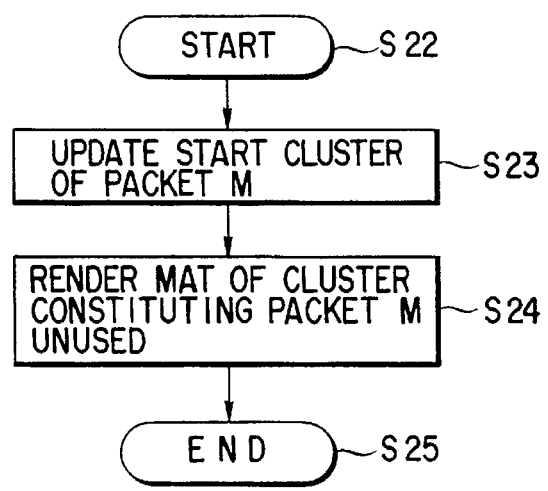
FIG. 26 is a flow chart for explaining an erase command output from the electronic still camera main body side to the memory card in the ninth embodiment.

Assume that the EEPROM card is used in the electronic still camera main body CA in the same manner as the SRAM card. In this case, the above-mentioned unnecessary data processing mode designation data is supplied from the electronic still camera main body CA. In addition, the electronic still camera main body CA outputs address data AD and digital data DA for erasing the header data of packet M in which the unnecessary image data are recorded. More specifically, the processing shown in FIG. 26 is performed under the control of the data processing controller 16. When the routine is started (step S22), the start cluster is updated (e.g., "00h") in step S23. In step 24, the MATs of the clusters constituting packet M are rendered unused (e.g., "00h"). with this operation, the routine is ended (step S25). In the case of packet 3 in FIG. 22, the start cluster of packet 3 is updated to be "00h", and the MAT of each of clusters 6, 8, and 9 is updated to be "00h".

Consequently, when the unnecessary data processing mode is designated, the data processing controller 16 executes the processing shown in FIG. 27 following the above-described processing. When the routine is started (step S26), the data processing controller 16 checks in step S27 whether the MAT of a cluster is rendered unused. If it is not rendered unused (NO in step S27), the routine is ended (step S28). If it is rendered unused (YES in step S27), the blocks constituting the cluster are erased in units of blocks in step S29. Subsequently, the data processing controller 16 checks in step S30 whether the last block of the cluster is erased. If the last block is not erased (NO in step S30), the flow returns to step S29. If the last block is erased (YES in step S30), it is checked in step S31 whether the MAT of another cluster is rendered unused. If it is rendered unused (YES in step S31), the flow returns to step S29. If it is not rendered unused (NO in step S31), the routine is ended (step S28).

According to the ninth embodiment, in the unnecessary data processing mode, when the header data of unnecessary image data is rendered unused upon processing on the electronic still camera main body CA side, the image data is automatically erased on the card side. Therefore, erase processing of image data need not be performed when rewrite processing is to be performed. With this, the write processing time can be greatly shortened, and hence the EEPROM card can be used in the electronic still camera main body CA in the same manner as the SRAM card.

Figure 28:
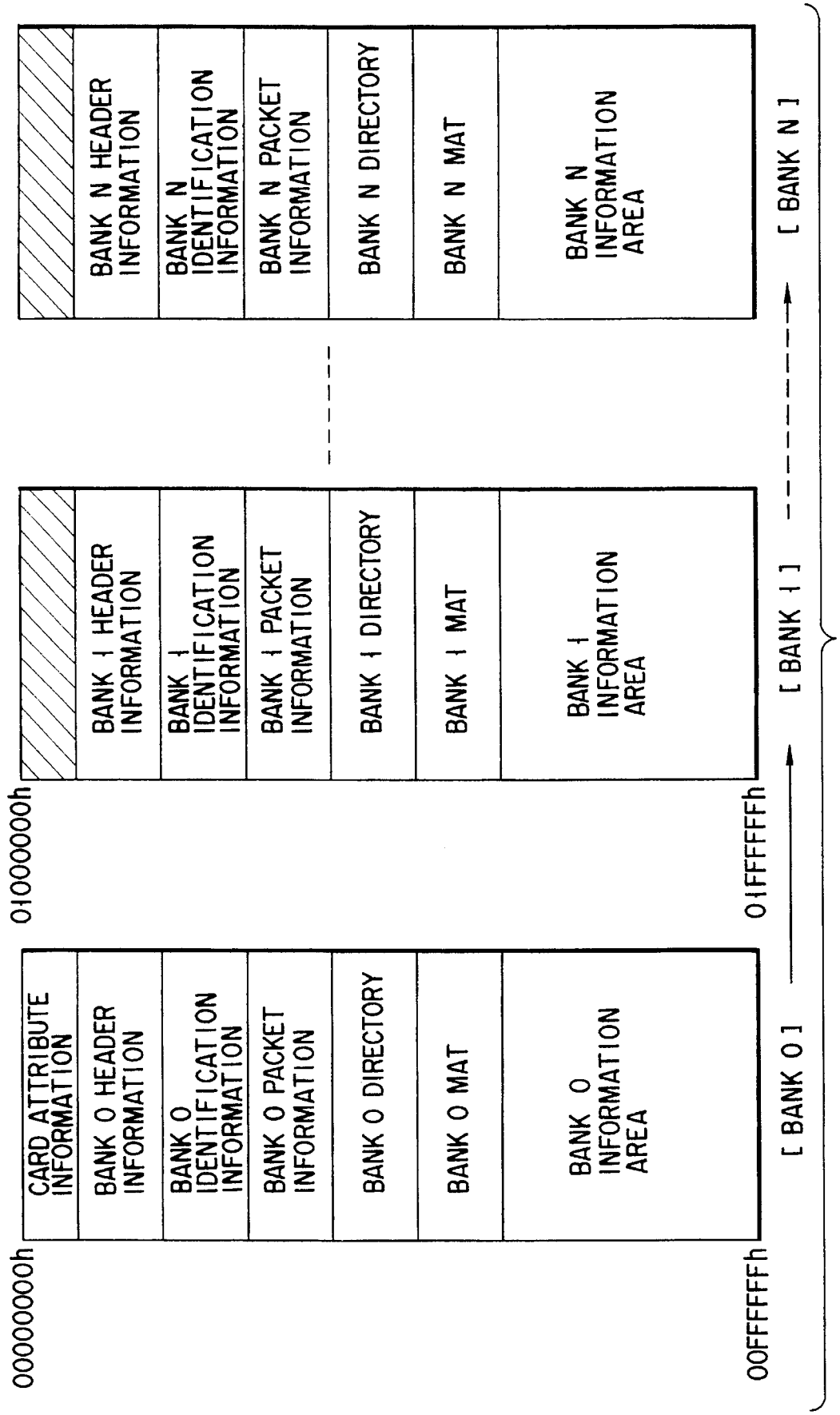
FIG. 28 is a view for explaining the memory space of an EEPROM in a memory card apparatus according to the tenth embodiment of the present invention.

The tenth embodiment of the present invention will be described below. The memory space of an EEPROM 19 is divided into N banks, as shown in FIG. 28, according to the format, of a memory card used for an electronic still camera, which is currently being standardized. Each band is divided into a header data storage area A and an image data storage area B. The storage space of each bank is formatted in units of clusters. Each cluster is constituted by M (a fixed value of 1 or more) erase blocks, as shown in FIG. 29. Data are processed in units of packets. As shown in FIG. 30, each packet is constituted by L (an arbitrary value of 1 or more) clusters.

FIGS. 31A and 31B respectively show the data format of the header data storage area A of bank 0 as an example. In this area, an area corresponding to absolute addresses 0h to 3FFh is a recording area for attribute information inherent in a card, and an area corresponding to addresses 400h to 3FFFh is a recording area for various types of information used for address management of image data stored at address 4000h and the subsequent addresses (in the image data storage area) and associated with the image data, e.g., bank/header information, packet selection information, information associated with packets, directory information, and MAT (memory allocation table) information.

If image data read out from the EEPROM 19 are written in another recording medium, and the EEPROM 19 is initialized (erased), the EEPROM 19 can be used as a new memory. In addition, it may be required that a specific bank be initialized by, e.g., editing. Under these circumstances, when all the banks are to be initialized, the electronic still camera main body CA outputs initialization command data to the memory card body 11 without designating the banks. When specific banks are to be initialized, the electronic still camera main body CA outputs initialization command data including bank designation data to the memory card body 11.

In the case of the SRAM card, since overwrite processing can be performed, only the header storage area is initialized by an initialization command. In contrast to this, in the EEPROM 19, since overwrite processing cannot be performed, if only the header data storage area is initialized, erase processing of the image data storage area must be performed in a write operation. In addition, since the erase processing is executed by repeating block erase processing, write processing takes much time.

For this reason, upon reception of initialization command data, a data processing controller 16 executes the following erase processing with respect to the EEPROM 19.

The data processing controller 16 checks first whether initialization command data is input. If it is input, the data processing controller 16 checks whether banks are designated. If no banks are designated, it is determined that all bank batch initialization is to be performed. As a result, the data processing controller 16 performs control to repeatedly erase all the data in the header storage areas A of all banks 0 to N in FIG. 28. In addition, upon detecting the completion of initialization of the header data storage areas A of all bank 0 to N, the data processing controller 16 performs control to repeatedly erase all the data in the image data storage areas B of all banks 0 to N. This operation is performed by chip erase processing. With this operation, initialization of the entire area of the EEPROM 19 is completed within a short period of time.

If bank designation is determined, the data processing controller 16 performs control to repeatedly erase all the data in the header data storage areas A of the respective designated banks. In addition, upon detecting the completion of initialization of the header data storage areas A of the respective designated banks, the data processing controller 16 performs control to repeatedly erase all the data in the image data storage areas B of the designated banks. This operation is performed by chip erase processing. With this operation, initialization of the entire area of the designated banks is completed within a short period of time.

Another initialization means will be described below. The header data storage area of each of banks 0 to N is constituted by the card attribute area from address 0h to address 3FFh, and the address management information area from address 400h to address 3FFFh, as shown in FIGS. 31A and 31B (although FIGS. 31A and 31B respectively show the format of bank 0, other banks have the same format). Of the two areas, the card attribute information area need not be initialized. In addition, the use state of the entire storage area of a bank is recorded in a temporary information taple from address 404h to address 40Fh.

The electronic still camera main body CA, therefore, updates/initializes the temporary information taple of a given band in the memory card body 11. Upon detection of this update processing, the data processing controller 16 refers to the corresponding taple to determine that initialization of the bank is to be performed. The data processing controller 16 collectively erases address management data at address 800h to address 3FFFh in the header storage area A. In addition, the data processing controller 16 collectively erases data at address 4000h to address FFFFFFh in the image data storage area B.

Note that a portion to be initialized in advance is not limited to a temporary information taple. Even if an address management portion from address 800h to address 3FFFh is initialized in advance, the same operation as described above can be performed as long as the initialization can be detected.

According to the tenth embodiment, in the erase processing mode, when header data HD is rendered unused by erase processing on the electronic still camera main body CA side, corresponding data in the image data storage area is automatically erased on the memory card body 11 side. Therefore, a rewrite operation can be performed without performing erase processing of image data, and the write processing time can be greatly shortened. Consequently, the EEPROM card can be used for the electronic still camera main body CA in the same manner as the SRAM card.

As the EEPROM 19, a cell using a NAND type structure has recently been developed. FIGS. 32A and 32B respectively show the planar structure of this NAND type cell (8 bits) and its equivalent circuit. An erase operation of a cell having such a structure is performed as follows. When, for example, a voltage of 0 V is applied to a bit line BL, and a voltage of 17 V is applied to control gates SGn and CGn, charges are accumulated in floating gates M1 to M8, and one-byte data can be erased. By applying this operation, erase processing can be performed with respect to a cell array as one block, which is constituted by a plurality of NAND type cells connected to each other.

Consider the memory card body 11 having a large capacity of 1 Mbits or more. The types and number of data to be recorded in this card are indefinite. An erase operation with respect to the card in which a plurality of data are recorded is performed to erase only target data, but the remaining data must be preserved. Therefore, the size of each block constituted by NAND type cells connected to each other is set such that batch erase processing of each block does not influence the remaining data. That is, the block size is considerably small as compared with the total capacity of the card.

Data of several hundred kbytes or more are recorded in such a NAND type EEPROM card. When some data are to be erased or all the data are to be erased by initializing the memory card body 11, erase processing must be repeatedly performed in units of blocks. If the time taken to erase data in one block is represented by t [sec], and the number of blocks in which data are erased is represented by n [blocks], a time S1 required for erase processing is given by $$S1 = n \cdot t \quad (1)$$

In order to erase data in one block, addresses and initialization must be designated, and the time required for interface processing must be also considered. If this time is represented by x [sec], and the number of blocks subjected to erase processing is represented by n [blocks], a time S2 required for interface processing is given by $$S2 = n \cdot x \quad (2)$$

A time S required for the overall erase operation of the card is given by $$S = S1 + S2 = n \cdot t + n \cdot x \quad (3)$$

In order to initialize the entire data storage area of the memory card body 11 using the above-described EEPROM 19 as a semiconductor memory, erase processing must be repeatedly performed with respect to all the blocks in units of blocks. Therefore, as is apparent from equation (3), the time S [sec] required for initialization of the card is greatly prolonged because the time required for interface processing is multiplied by the number of blocks subjected to erase processing.

If, therefore, the NAND type EEPROM card is initialized according to the above-described initialization processing, since only required areas are chip-erased, the initialization time can be shortened by the time required for interface processing. As a result, the time required for image data write processing can be minimized, and hence the EEPROM card can be used in the SRAM-card-like manner.

What is claimed is:

1. A memory card apparatus for receiving and storing data from an external unit, said data including a first data group including at least one group of first data which is read/written in units of bytes, and a second data group including at least one group of second data which is sequentially arranged as a whole, each second group of data being larger than each first group of data, said memory card comprising:

memory for inputting and outputting said data with respect to said external unit, said memory being capable of high-speed read and write operations;

a first EEPROM for performing read and write operations with respect to said memory, said first EEPROM having a storage capacity large enough to record said first data group and being capable of performing said read and write operations in units of bytes;

a second EEPROM for performing read and write operations with respect to said memory, said second EEPROM having a storage capacity large enough to record said second data group and being capable of performing a data read/write operation in units of reference areas, each reference area having a plurality of consecutive bytes; and control means for characterizing data stored in said memory as one of said first data group and said second data group and for writing said data to a selected one of said first and second EEPROMs based on said characterization, said control means including:

write control means for, after data has been transferred from said memory to said selected EEPROM and written therein, reading out said data written in said selected EEPROM, comparing said readout data with said data stored in said memory, and again transferring said data from said memory to said selected EEPROM when said readout data and said data stored in said memory do not coincide with each other, clock switching means for effecting a first switch and a second switch, said first switch being between an input operation in which data supplied from said external unit is input to said memory and an output operation in which data from said memory is output to said external unit, said first switch being effected based on a first clock which is supplied from said external unit, and said second switch being between a writing operation in which data from said memory is transferred to and written in said selected EEPROM and a reading operation in which data from said selected EEPROM is read into said memory, said second switch being effected based on an internally generated second clock; and refusal signal generation means for, while data from said memory is being read out from and written into said second EEPROM in units of reference areas, generating and outputting a data input refusal signal for refusing input of data from said external unit.

2. The memory card apparatus according to claim 1, wherein each of said first and second EEPROMs include:
   a data area for recording data in units of reference areas; and
   a management area for recording management information corresponding to said data recorded in said data area, and
   wherein said control means records a data update count in a part of said data area when a corresponding reference area is updated with data.

3. The memory card apparatus according to claim 1, wherein each of said first and second EEPROMs include:
   a data area for recording data in units of reference areas; and
   a management area for recording management information corresponding to said data recorded in said data area, and
   wherein said control means records a data erase count in a part of said management area when data is erased from a part of a corresponding data area.

4. The memory card apparatus according to claim 1, further comprising:
   error detection means for detecting a presence/absence of an error within said reference areas of said second EEPROM;
   error flag write means for recording error flags representing said detected presence/absence of an error from within each of said reference areas, said error flags being recorded in one of said reference areas designated as an error flag area;
   data write substitute means for writing data written in one of said reference areas flagged with an error into a free area which is designated as a substitute area;
   address write means for writing a substitute address in said error reference area when data is written in said substitute area, said substitute address corresponding to a location within said substitute area of said data which was written by said data write substitute means, and
   data read means for determining said error reference area by referring to said error flag area, determining said substitute address by reading out data from said error reference area, and reading out said data from said substitute reference area on the basis of said determined address.

5. The memory card apparatus according to claim 4, wherein:
   said address write means writes said substitute address in a plurality of bytes in said error reference area, and
   said data read means reads out data from a plurality of bytes in said error reference area to determine a substitute address by majority.

6. A memory card apparatus for receiving and storing data from an external unit including a first data group having data which is written/read in units of bytes, and a second data group having data which is sequentially arranged, a total data amount of said second data group being larger than a total data amount of said first data group, said memory card apparatus comprising:
   memory for performing one of an input operation and an output operation with respect to said external unit, said memory being capable of high-speed read and write operations;
   an EEPROM for performing one of a read operation and a write operation with respect to said memory, said EEPROM having first and second storage areas which are large enough to store all said data of said first data group and all said data of said second data group, respectively, said EEPROM being capable of performing one of a data write operation, a data read operation and a data erase operation in units of reference areas, each reference area being constituted by a plurality of consecutive bytes; and
   control means for, when a request is made to update data of said first data group stored in said EEPROM in units of bytes, transferring all data from said first storage area of said EEPROM to said memory, updating a date associated with said first data group in said memory in units of bytes, and then transferring and writing all of said data from said memory into said first storage area of said EEPROM in units of reference areas, said control means including:
      write control means for reading out data from said EEPROM, comparing said readout data with data stored in said memory, and again transferring said data from said memory to said EEPROM when data is transferred from said memory to said EEPROM and written therein, and for writing said transferred data therein when said readout data and said data stored in said memory do not coincide;
      clock switching means for effecting a first switch and a second switch, said first switch being between an input operation in which data supplied from said external unit is received by and stored in said memory and an output operation in which data from said memory is output to said external unit based on a first clock which is supplied from said external unit together with data supplied therefrom, said second switch being between a writing operation in which data from said memory is transferred and written into said EEPROM and a reading operation in which data from said EEPROM is stored in said memory based on an internally generated second clock; and
      refusal signal generation means for generating and outputting a data input refusal signal for refusing input of data from said external unit while data from said memory is being read from and written into said EEPROM in units of single reference areas.

7. The memory card apparatus according to claim 6, wherein said EEPROM includes:
   a data area for recording data in units of reference areas; and
   a management area for recording management information of said data recorded in said data area, and wherein
   said control means records a data update count in a part of said management area every time data update processing is performed with respect to a reference area in a corresponding part of said data area of said EEPROM.

8. The memory card apparatus according to claim 6, wherein said EEPROM includes:
   a data area for recording data in units of said reference areas; and
   a management area for recording management information of said data recorded in said data area, and wherein
   said control means records a data erase count in a part of said management area every time data erase processing is performed with respect to a reference area in a corresponding part of said data area of said EEPROM.

9. The memory card apparatus according to claim 6, wherein said refusal signal generation means outputs a signal for refusing input of data to be supplied from said external unit and written in said EEPROM, said signal being output while data is stored in said memory in units of said reference areas.

10. The memory card apparatus according to claim 6, wherein said externally supplied data includes a data pattern in an end portion of a reference area which is never generated in a normal operation, and wherein said control means further comprises:

detection means for detecting a data end in said reference area when said data pattern is received; and addition means for adding dummy data to an empty portion of said reference area based on factors including an output from said detection means.

11. The memory card apparatus according to claim 6, wherein said control means further comprises:

a memory for recording externally supplied data in units of bytes;

determining means for, after data of a predetermined number of bytes constituting a first reference area is input to said memory, determining whether data constituting a second reference area following said first reference area is input in units of bytes; and erase means for, when said determining means determines that said data constituting said second reference area is input, transferring said data, recorded in said memory and constituting said first reference area to said EEPROM and writing said data therein, and erasing a storage area of said EEPROM in units of reference areas to write said data constituting said second reference area therein.

* * * * *